United States Patent
Kawakami et al.

(10) Patent No.: US 8,716,717 B2
(45) Date of Patent: May 6, 2014

(54) SEMICONDUCTOR DEVICE AND METHOD FOR MANUFACTURING THE SAME

(75) Inventors: Tsuyoshi Kawakami, Tokyo (JP); Akihiko Furukawa, Tokyo (JP); Naruhisa Miura, Tokyo (JP); Yasuhiro Kagawa, Tokyo (JP); Kenji Hamada, Tokyo (JP); Yoshiyuki Nakaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/816,511

(22) PCT Filed: Apr. 15, 2011

(86) PCT No.: PCT/JP2011/059397
§ 371 (c)(1),
(2), (4) Date: Feb. 12, 2013

(87) PCT Pub. No.: WO2012/049872
PCT Pub. Date: Apr. 19, 2012

(65) Prior Publication Data
US 2013/0140582 A1 Jun. 6, 2013

(30) Foreign Application Priority Data
Oct. 15, 2010 (JP) ................. 2010-232174

(51) Int. Cl.
*H01L 29/12* (2006.01)
(52) U.S. Cl.
USPC ............. 257/76; 257/77; 257/288; 257/472; 257/492; 257/E29.18; 438/529
(58) Field of Classification Search
USPC ............. 257/76, 77, 288, 471–472, 492–493
See application file for complete search history.

(56) References Cited

U.S. PATENT DOCUMENTS

| | | | |
|---|---|---|---|
| 6,002,159 | A | 12/1999 | Bakowski et al. |
| 6,040,237 | A | 3/2000 | Bakowski et al. |

(Continued)

FOREIGN PATENT DOCUMENTS

| | | |
|---|---|---|
| JP | 2000 516767 | 12/2000 |
| JP | 3708057 | 10/2005 |

(Continued)

OTHER PUBLICATIONS

Stengl, R., et al., "Variation of Lateral Doping-A New Concept to Avoid High Voltage Breakdown of Planar Junctions," IEDM, vol. 85, No. 6.4, pp. 154-157 (1985).
International Search Report Issued Jul. 19, 2011 in PCT/JP11/59397 Filed Apr. 15, 2011.
English Translation of the International Preliminary Report on Patentability issued May 2, 2013 in PCT/JP2011/059397.
English Translation of the Written Opinion of the International Searching Authority issued Jul. 19, 2011 in PCT/JP2011/059397.

*Primary Examiner* — Mamadou Diallo
(74) *Attorney, Agent, or Firm* — Oblon, Spivak, McClelland, Maier & Neustadt, L.L.P.

(57) ABSTRACT

A RESURF layer including a plurality of P-type implantation layers having a low concentration of P-type impurity is formed adjacent to an active region. The RESURF layer includes a first RESURF layer, a second RESURF layer, a third RESURF layer, a fourth RESURF layer, and a fifth RESURF layer that are arranged sequentially from the P-type base side so as to surround the P-type base. The second RESURF layer is configured with small regions having an implantation amount equal to that of the first RESURF layer and small regions having an implantation amount equal to that of the third RESURF layer being alternately arranged in multiple. The fourth RESURF layer is configured with small regions having an implantation amount equal to that of the third RESURF layer and small regions having an implantation amount equal to that of the fifth RESURF layer being alternately arranged in multiple.

15 Claims, 36 Drawing Sheets

(56) References Cited

U.S. PATENT DOCUMENTS

| | | |
|---|---|---|
| 6,831,345 B2 | 12/2004 | Kinoshita et al. |
| 7,049,675 B2 | 5/2006 | Kinoshita et al. |
| 7,919,403 B2 | 4/2011 | Tarui |
| 8,106,451 B2 * | 1/2012 | Khalil .......................... 257/339 |
| 8,350,353 B2 | 1/2013 | Tarui |
| 2008/0224150 A1 * | 9/2008 | Suzuki et al. .................. 257/77 |
| 2009/0212301 A1 | 8/2009 | Zhang et al. |
| 2010/0148823 A1 * | 6/2010 | Shimizu ........................ 326/102 |
| 2011/0180870 A1 * | 7/2011 | Pendharkar ................... 257/337 |

FOREIGN PATENT DOCUMENTS

| | | |
|---|---|---|
| JP | 3997551 | 10/2007 |
| JP | 2008 103529 | 5/2008 |
| JP | 2010 267783 | 11/2010 |
| WO | 2009 108268 | 9/2009 |

* cited by examiner

F I G . 1
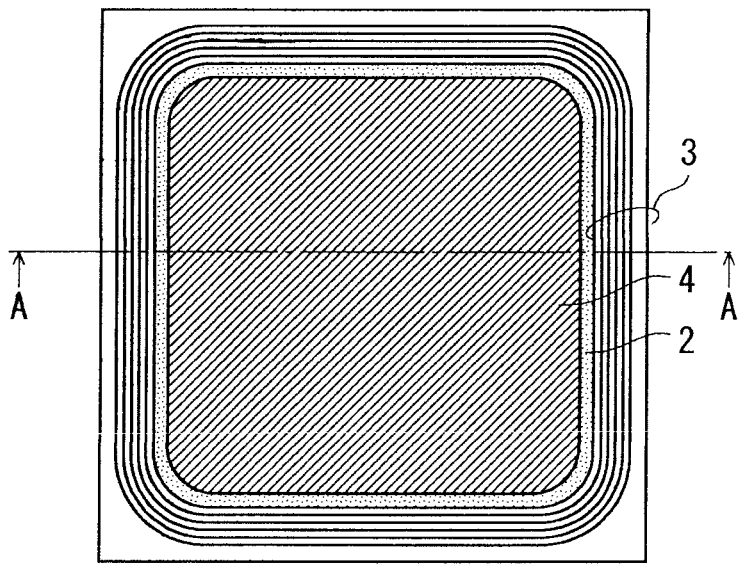
F I G . 2
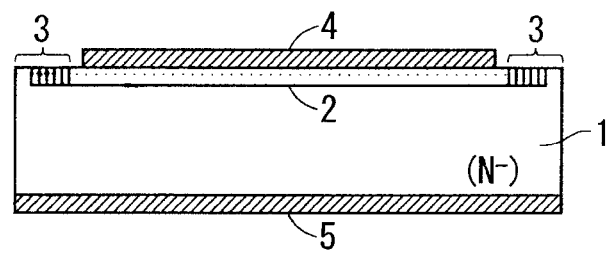

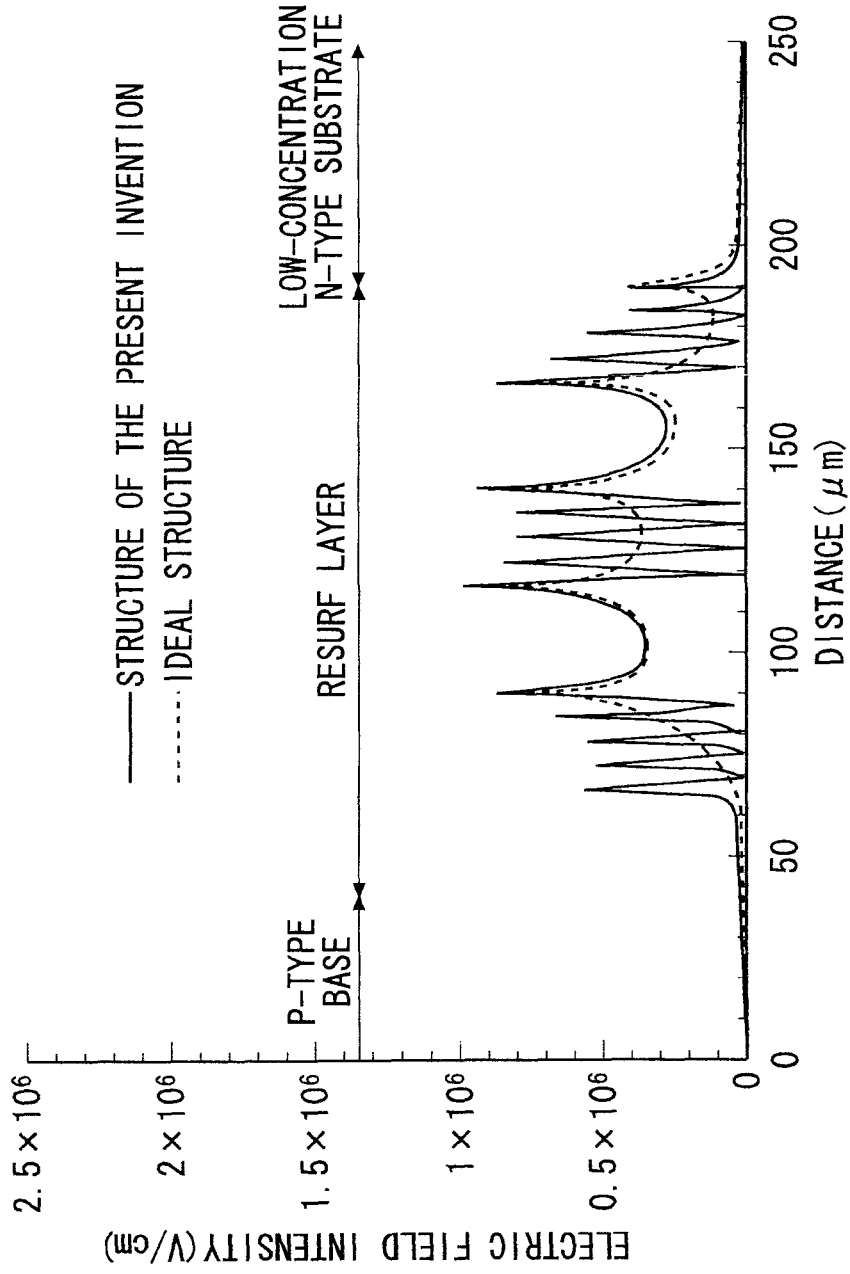

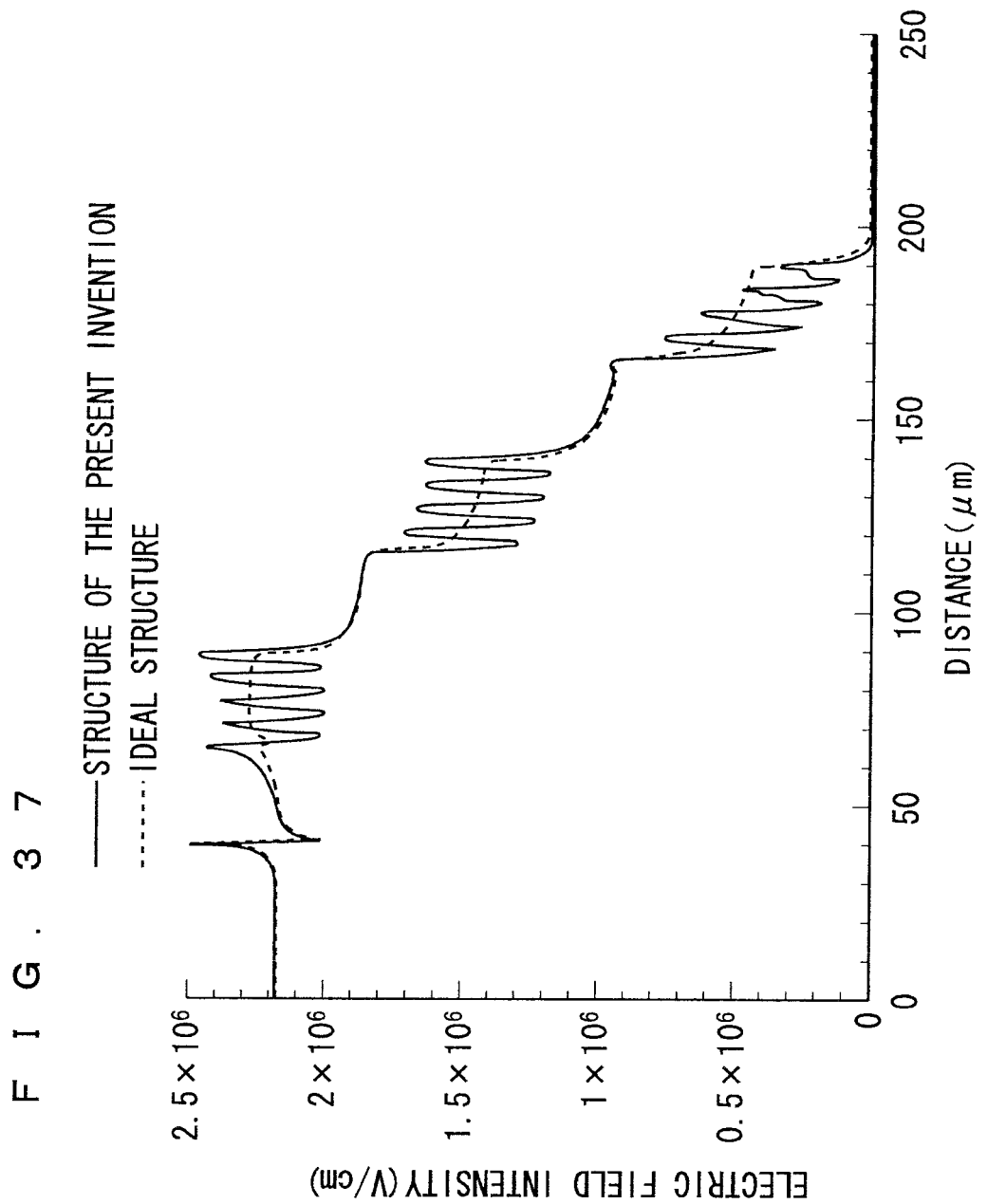

SEMICONDUCTOR DEVICE AND METHOD FOR MANUFACTURING THE SAME

TECHNICAL FIELD

The present invention relates to a semiconductor device, and mainly relates to a power semiconductor device having a breakdown voltage of one kilovolt or higher.

BACKGROUND ART

In a semiconductor device, as typified by a diode, a MOSFET (Metal-Oxide-Semiconductor Field-Effect-Transistor), and an IGBT (Insulated Gate Bipolar Transistor), a termination region for enhancing breakdown voltage performance is formed so as to surround a region (active region) that functions as an active element.

The breakdown voltage of a semiconductor device includes a reverse breakdown voltage of a diode and an off breakdown voltage of a transistor. Either of them is a breakdown voltage in a case where the semiconductor device does not function as the active element, and a depletion layer spreading in the semiconductor maintains the breakdown voltage performance.

Here, in a semiconductor device having no termination region provided in an active region, only a low breakdown voltage is obtained, because the spread of a depletion layer is insufficient and moreover, due to geometric effects, an electric field concentrates in the boundary (normally having a columnar shape) of the depletion layer against the active region side. Accordingly, a configuration is adopted in which an implantation layer having the conductive type opposite to that of a semiconductor substrate is formed adjacent to a peripheral portion of the active region, to thereby expanding the depletion layer so that the concentration of an electric field in the peripheral portion of the active region is relieved and thus the breakdown voltage of the semiconductor device is increased. This configuration for increasing the breakdown voltage, which is provided outside the active region, is called a termination region.

For example, the breakdown voltage of a PN junction made by an N-type semiconductor substrate and a high-concentration P-type implantation layer is lowered since an electric field concentrates in a columnar junction of the peripheral portion of the high-concentration P-type implantation layer. Accordingly, when the low-concentration P-type implantation layer is formed adjacent to the peripheral portion of the high-concentration P-type implantation layer, the depletion layer spreads over both the N-type semiconductor substrate (drift layer) and the low-concentration P-type implantation layer. Thus, the breakdown voltage is increased. This low-concentration P-type implantation layer is generally called a RESURF (RESURF: Reduced Surface Field) layer or a JTE (Junction Termination Extension). Such a termination region structure is called a RESURF structure.

In the RESURF structure, the depletion layer spreads over both the drift layer and the RESURF layer, and thereby high breakdown voltage performance is obtained. The spread of the depletion layer depends on the equilibrium of the amount of space charges. Therefore, optimum implantation conditions (implantation conditions by which the highest breakdown voltage is obtained) in the RESURF layer are determined not by the concentration but by the implantation amount (dose amount). In a case where the implantation amount throughout the RESURF layer is uniform, an optimum implantation amount (implantation surface density) is, irrespective of the drift layer concentration, about $1 \times 10^{12}$ cm$^{-2}$ in a case of a Si (silicon) substrate, and about $1 \times 10^{13}$ cm$^{-2}$ (when the rate of activation is 100%) in a case of a 4H—SiC (silicon carbide) substrate. These are called RESURF conditions.

However, the RESURF structure has a demerit that, in order to obtain high breakdown voltage performance, the electric field intensity in the outermost periphery of the RESURF layer inevitably increases. As a result, an increase in the breakdown voltage is limited to the breakdown voltage in the outermost periphery of the RESURF layer, and a risk of occurrence of thermal destruction and flashover due to a short-circuit current caused in the breakdown increases.

Such concentration of an electric field in the outermost periphery of the RESURF layer is caused mainly by bias in the distribution of space charges in the depletion layer. More specifically, in the outermost periphery of the RESURF layer, cancellation is not successfully caused in the vector sum of electric fields from space charges (in a case of P-type, acceptor ions with negative charge) of the RESURF layer and space charges (in a case of N-type, donor ions with positive charge) of the drift layer. From a qualitative viewpoint, the depth of the depletion layer in the drift layer gradually decreases in a direction from the active region toward the outside of the RESURF layer. Accordingly, by progressively reducing the implantation amount in the RESURF layer toward the outside as disclosed in Non-Patent Document 1, the concentration of an electric field in the RESURF layer can be avoided.

As a result of the avoidance of the concentration of an electric field in the RESURF layer, an increased margin is obtained with respect to the breakdown electric field. Thus, under condition that the termination region has the same width, a higher breakdown voltage is obtained. From another viewpoint, the width of the termination region required for obtaining a certain breakdown voltage can be reduced. Additionally, progressively reducing the implantation amount in the RESURF layer toward the outside can improve the resistance to interface charges and an external electric field.

In a method for forming the RESURF layer disclosed in Non-Patent Document 1, an impurity is implanted by using a mask with the percentage of openings in the mask being varied, and then thermally diffused to thereby uniformize the concentration. However, such a method requires a mask pattern that is finer than the thermal diffusion length of the impurity. Therefore, this method cannot be applied when a thick-film resist mask is needed, such as when MeV (Mega-Electron-Volt) ion implantation is performed. Also, this method cannot be used for a semiconductor material, such as SiC, in which thermal diffusion of an impurity is extremely small.

Practically, therefore, a RESURF structure in which the implantation amount in the RESURF layer decreases stepwise toward the outside is adopted, as in Patent Documents 1 and 2. In this case, an electric field concentrates not only in the peripheral portion of the active region but also a boundary between RESURF layers having different implantation amounts and in the outermost periphery of the RESURF layer. However, under the condition that the same bias voltage is applied, the concentration of an electric field is largely relieved as compared with the RESURF layer having a single implantation amount.

PRIOR-ART DOCUMENTS

Patent Documents

Patent Document 1: Japanese Patent No. 3997551
Patent Document 2: National Publication of Translation No. 2000-516767

Non-Patent Documents

R. Stengl and U. Gosele, "VARIATION OF LATERAL DOPING—A NEW CONCEPT TO AVOID HIGH VOLTAGE BREAKDOWN OF PLANAR JUNCTIONS," IEDM 85, p. 154, 1985.

SUMMARY OF THE INVENTION

Problems to be Solved by the Invention

In a semiconductor device having the above-described RESURF structure in which the implantation amount in the RESURF layer decreases stepwise toward the outside, the concentration of an electric field in the RESURF layer is further relieved by increasing the number of levels of the implantation amount in the RESURF layer. However, there is a problem that as the number of levels of the implantation amount increases, the number of times a photolithography process for forming a mask and an impurity implantation process are performed increases by the same amount.

The present invention has been made to solve the above-described problem, and an object of the present invention is to provide a semiconductor device including a RESURF structure that enables the number of levels of the implantation amount in a RESURF layer to be increased with suppression of an increase in the number of times a photolithography process and an impurity implantation process are performed.

Means for Solving the Problems

An aspect of a semiconductor device according to the present invention includes: an active region (2) formed in a surface of a semiconductor layer (1) having a first conductive type; and a plurality of electric field relief layers that are defined by impurity regions having a second conductive type, the plurality of electric field relief layers being arranged from a peripheral portion of the active region toward the outside so as to surround the active region. The plurality of electric field relief layers are configured such that an impurity implantation amount decreases from the active region side toward the outside. The plurality of electric field relief layers include: a first electric field relief layer whose entire region is implanted with an impurity having the second conductive type at a first surface density; a second electric field relief layer whose entire region is implanted with an impurity having the second conductive type at a second surface density; and a third electric field relief layer configured with a plurality of first small regions and a plurality of second small regions being alternately arranged, the first small region having a width in a plane direction smaller than that of the first electric field relief layer, the first small region being implanted with an impurity having the second conductive type at the first surface density, the second small region having a width in the plane direction smaller than that of the second electric field relief layer, the second small region being implanted with an impurity having the second conductive type at the second surface density. The third electric field relief layer is arranged between the first electric field relief layer and the second electric field relief layer, and the average surface density of the third electric field relief layer takes a value between the first surface density and the second surface density.

Effects of the Invention

In the aspect of the semiconductor device according to the present invention, the plurality of electric field relief layers include the third electric field relief layer in which the plurality of first small regions and the plurality of second small regions are alternately arranged. The width of the first small region in the plane direction is smaller than that of the first electric field relief layer, and the first small region is implanted with the impurity having the second conductive type at the first surface density. The width of the second small region in the plane direction is smaller than that of the second electric field relief layer, and the second small region is implanted with the impurity having the second conductive type at the second surface density. For the formation of the third electric field relief layer, the step of forming the first and second electric field relief layers can be used. A special photolithography process and a special impurity implantation process are not required. Thus, the number of effective levels of the implantation amount in the RESURF layer can be increased with suppression of an increase in the number of times the photolithography process and the impurity implantation process are performed. As a result, a semiconductor device having high breakdown voltage performance and high reliability is obtained at a low cost.

BRIEF DESCRIPTION OF THE DRAWINGS

FIG. 1 A plan view showing a configuration in a case where the present invention is applied to a diode.

FIG. 2 A cross-sectional view showing a configuration in a case where the present invention is applied to a diode.

FIG. 36 A diagram showing a result of a simulation of the semiconductor device according to the embodiment 2 of the present invention.

FIG. 37 A diagram showing a result of a simulation of the semiconductor device according to the embodiment 2 of the present invention.

EMBODIMENT FOR CARRYING OUT THE INVENTION

Figure 3:
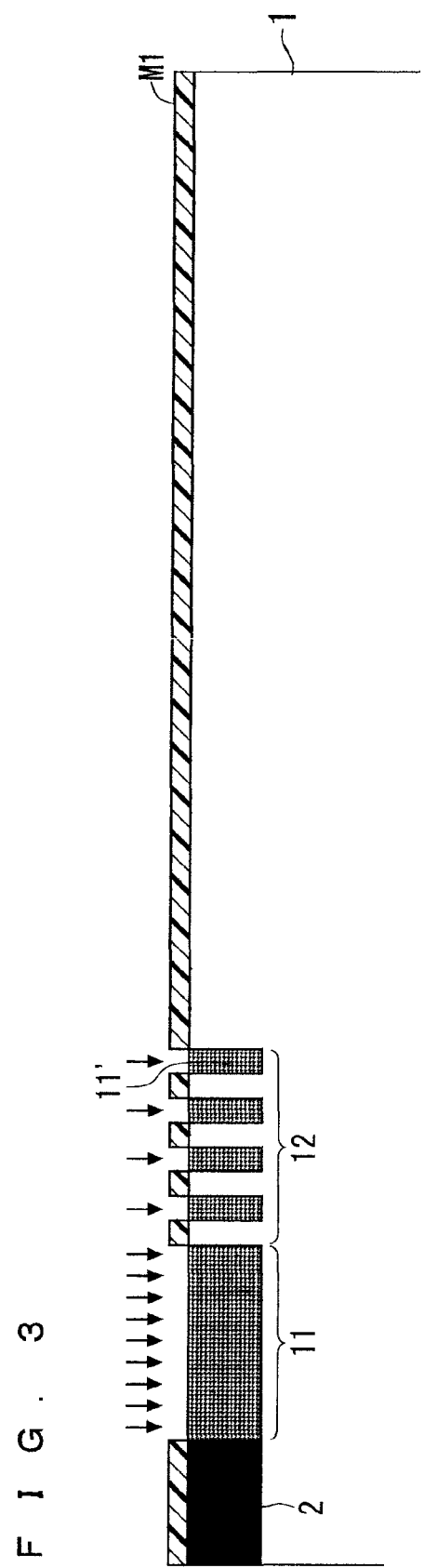
FIG. 3 A cross-sectional view showing a process of manufacturing a semiconductor device according to an embodiment 1 of the present invention.

Entire configuration in a case where the present invention is applied to diode.

FIG. 1 is a plan view showing a configuration of a diode 100 in a case where the present invention is applied to a diode. FIG. 2 is a cross-sectional view as taken along the line A-A indicated by the arrows in FIG. 1. As shown in FIGS. 1 and 2, the diode 100 includes a semiconductor substrate 1 containing a relatively low concentration of N-type impurity, an active region 2 formed in a surface of the semiconductor substrate 1 and including an implantation layer containing a relatively high concentration of P-type impurity, and a termination region 3 formed so as to surround the active region 2 and including a plurality of P-type implantation layers with different concentrations. Additionally, an anode electrode 4 is arranged on the active region 2, and a cathode electrode 5 is arranged on a main surface (back surface of the substrate) of the semiconductor substrate 1 opposite to the surface where the anode electrode 4 is arranged.

In such a configuration, when a bias voltage is applied between the anode electrode 4 that is in contact with the active region 2 and the cathode electrode 5 that is provided on the back surface of the substrate, the diode 100 functions as a PN junction diode.

In the following, an embodiment of a semiconductor device according to the present invention will be described, with focus mainly on a configuration of the termination region.

A. Embodiment 1

A configuration of and a method for manufacturing the termination region according to an embodiment 1 of the present invention will be described with reference to FIGS. 3 to 5.

A-1. Configuration of Device

Figure 4:
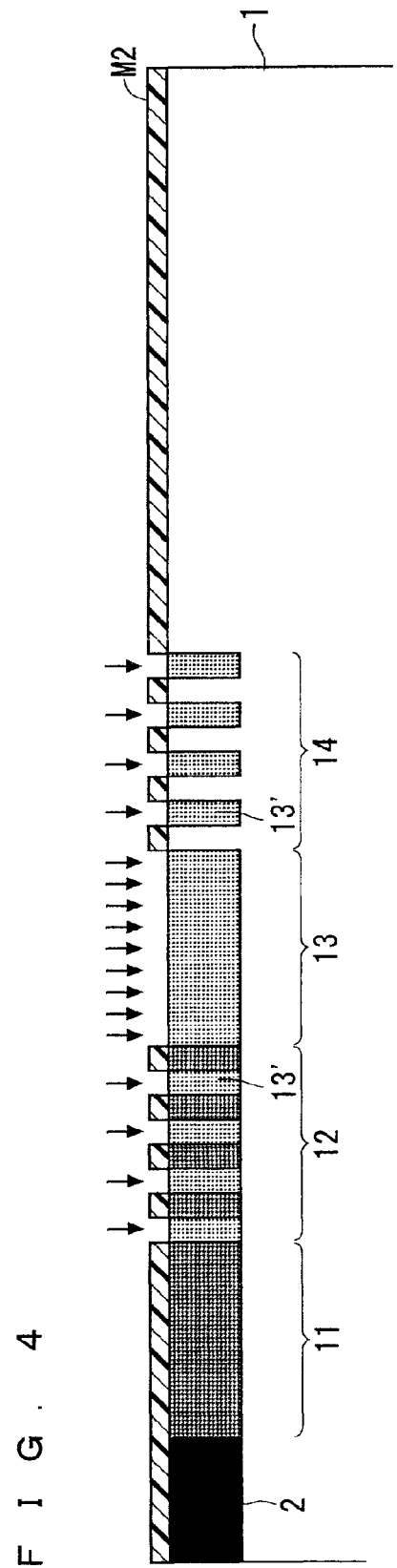
FIG. 4 A cross-sectional view showing the process of manufacturing the semiconductor device according to the embodiment 1 of the present invention.
Figure 5:
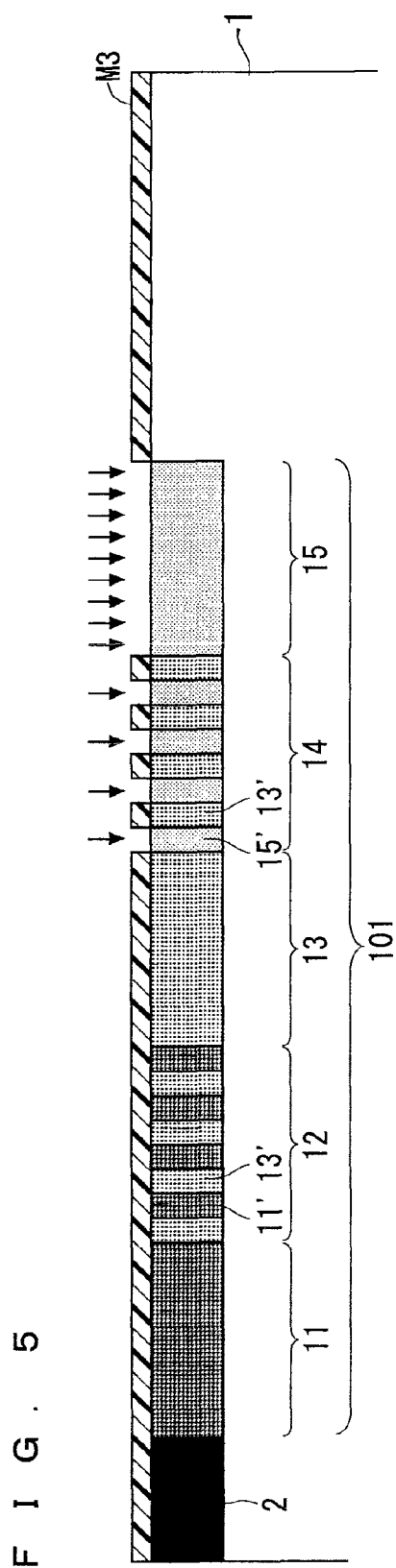
FIG. 5 A cross-sectional view showing the process of manufacturing the semiconductor device according to the embodiment 1 of the present invention.

FIGS. 3 to 5 are cross-sectional views sequentially showing a process of manufacturing the termination region. A final configuration of the termination region is indicated as a RESURF layer 101 in FIG. 5 showing the final step.

As shown in FIG. 5, the RESURF layer 101, which includes a plurality of P-type implantation layers containing relatively low concentrations of P-type impurity, is formed adjacent to the active region (P-type base) 2 containing a relatively high concentration of P-type impurity. A region where the RESURF layer 101 is formed serves as the termination region.

The RESURF layer 101 includes a first RESURF layer 11, a second RESURF layer 12, a third RESURF layer 13, a fourth RESURF layer 14, and a fifth RESURF layer 15 that are arranged in the mentioned order from the P-type base 2 side and arranged so as to surround the P-type base 2. Thus, the RESURF layer 101 includes a plurality of RESURF layers (electric field relief layers), and this applies to other embodiments.

The second RESURF layer 12 is configured with small regions 11' and small regions 13' being alternately arranged in multiple. The implantation amount in the small regions 11' is equal to that in the first RESURF layer 11. The implantation amount in the small region 13' is equal to that in the third RESURF layer 13. The fourth RESURF layer 14 is configured with small regions 13' and small regions 15' being alternately arranged in multiple. The implantation amount in the small regions 13' is equal to that in the third RESURF layer 13. The implantation amount in the small regions 15' is equal to that in the fifth RESURF layer 15.

When such a configuration is adopted, the second RESURF layer 12 is, in an effective sense, regarded as having an implantation amount intermediate between that in the first RESURF layer 11 and that in the third RESURF layer 13, while the fourth RESURF layer 14 is, in an effective sense, regarded as having an implantation amount intermediate between that in the third RESURF layer 13 and that in the fifth RESURF layer 15.

Here, in a case where the RESURF layer 101 is set such that the first RESURF layer 11 has the highest implantation amount, the third RESURF layer 13 has an implantation amount lower than the implantation amount in the first RESURF layer 11, and the fifth RESURF layer 15 has an implantation amount lower than the implantation amount in the third RESURF layer 13, an effective implantation amount in the RESURF layer 101 decreases stepwise toward the outside of the diode 100.

Adoption of such a configuration can relieve the concentration of an electric field in a peripheral portion of an active region in a PN junction diode.

A-2. Manufacturing Method

Next, a method for forming the RESURF layer 101 will be described with reference to FIGS. 3 to 5. Firstly, by ion implantation, a P-type impurity is implanted into the surface of the semiconductor substrate 1 at a relatively high concentration, to thereby form the active region 2. In the semiconductor substrate 1 in this state, as shown in FIG. 3, an implantation mask M1 is patterned on the main surface on which the active region 2 has been formed. The implantation mask M1 is made of, for example, a resist material. In the following, a description will be given on the assumption that the implantation mask is made of a resist material.

The implantation mask M1 has a pattern in which portions corresponding to the first RESURF layer 11 and the small regions 11' in the second RESURF layer 12 are opening. A P-type impurity, such as aluminum (Al), is ion-implanted over the implantation mask M1, and thereby the entire first RESURF layer 11 and the small regions 11' in the second RESURF layer 12 are formed.

Then, after the implantation mask M1 is removed, in step shown in FIG. 4, an implantation mask M2 is patterned. The implantation mask M2 has a pattern in which portions corresponding to the small regions 13' in the second RESURF layer 12, the third RESURF layer 13, and the small regions 13' in the fourth RESURF layer 14 are opening. A P-type impurity, such as Al, is ion-implanted over the implantation mask M2, and thereby the entire third RESURF layer 13 and the small regions 13' in the second RESURF layer 12 and in the fourth RESURF layer 14 are formed.

Then, after the implantation mask M2 is removed, in step shown in FIG. 5, an implantation mask M3 is patterned.

The implantation mask M3 has a pattern in which portions corresponding to the fifth RESURF layer 15 and the small regions 15' in the fourth RESURF layer 14 are opening. A P-type impurity, such as Al, is ion-implanted over the implantation mask M3, and thereby the entire fifth RESURF layer 15 and the small regions 15' in the fourth RESURF layer 14 are formed.

In this manner, through the three implantation processes, the RESURF layer 101 having five levels of implantation amounts in an effective sense is formed. Thus, the effective number of levels of the implantation amount in the RESURF layer can be increased with suppression of an increase in the number of times an impurity implantation process is performed. As a result, a semiconductor device having high breakdown voltage performance and high reliability is achieved at a low cost.

Here, in a region where regions having two different implantation amounts are alternately arranged in multiple, such as in the second RESURF layer 12 and the fourth RESURF layer 14, an averaged implantation amount is considered as the effective implantation amount. Accordingly, it is effectual that the cycle of the alternate arrangement is short. More specifically, assuming a region having a certain effective implantation amount, it is desirable that the cycle of the alternate arrangement is equal to or less than ½ of the width (length with respect to a direction in which the layer is arranged) of the region (in other words, that four or more small regions are provided).

In the RESURF layer 101 shown in FIG. 5, all the implantation layers are formed without overlapping one another. However, the width of the implantation layer slightly expands because, for example, a masking part of the resist mask is thinned due to light diffusion during photolithography and impurity ions are scattered. Therefore, it is not likely that a non-implanted region occurs in the RESURF layer 101. Moreover, in a case where the thermal diffusion length is at an equal or higher level than the accuracy of alignment of the mask, an implanted impurity is thermally diffused by an annealing treatment. Therefore, it is less likely that a non-implanted region occurs in the RESURF layer 101.

Even if a non-implanted region occurs in the RESURF layer 101 due to misalignment of the mask, the implantation amount itself is not changed and therefore the averaged implantation amount within the region is not changed. From the viewpoint of high breakdown voltage performance, the amount of space charges (that is, the implantation amount) is important, because the RESURF layer is premised on being depleted. That is, even when misalignment of the mask occurs, the effect of the RESURF layer 101 that the concentration of the electric field is relieved is unchanged.

Here, it is desirable that the P-type base 2 and the first RESURF layer 11 are in contact with each other, and practically, it is desirable that the opening of the implantation mask M1 corresponding to the first RESURF layer 11 overlaps the P-type base 2. Even when the amount of the overlapping is large, no problem occurs because, basically, the depletion layer hardly spreads in the P-type base 2.

As for the other RESURF layers, the boundary thereof may be made overlap the adjacent RESURF layer in the masking step. However, this changes the effective implantation amount, and therefore it is desirable that the amount of the overlapping is as small as possible.

In a case described above, the P-type base 2 is formed and then the RESURF layer 101 is formed. However, either may precede the other, and there is not limit in the order in which the implantation layers included in the RESURF layer 101 are formed. Irrespective of the sequence in the implantation process, the same effect is obtained as long as the RESURF layer 101 shown in FIG. 5 is finally formed.

In the RESURF layer 101 shown in FIG. 5, all the first to fifth RESURF layers 11 to 15 have the same width. However, the width may not be the same. An optimum width of each region depends on the implantation amount (or the effective implantation amount) in the region.

In the RESURF layer 101 shown in FIG. 5, the first to fifth RESURF layers 11 to 15 have the same depth. However, in the three ion implantations described with reference to FIGS. 3 to 5, it may not be necessary that the depth of implantation is constant. An optimum depth depends on a relative depth of the implantation layer including the P-type base 2 and an implantation profile.

In the RESURF layer 101 shown in FIG. 5, there are two regions (the second RESURF layer 12 and the fourth RESURF layer 14) in which the averaged implantation amount is defined as the effective implantation amount. However, it may be possible that a portion in which a region defined by the effective implantation amount does not exist is provided between different regions with the same implantation amount (in FIG. 5, the first RESURF layer 11, the third RESURF layer 13, and the fifth RESURF layer 15).

Figure 6:
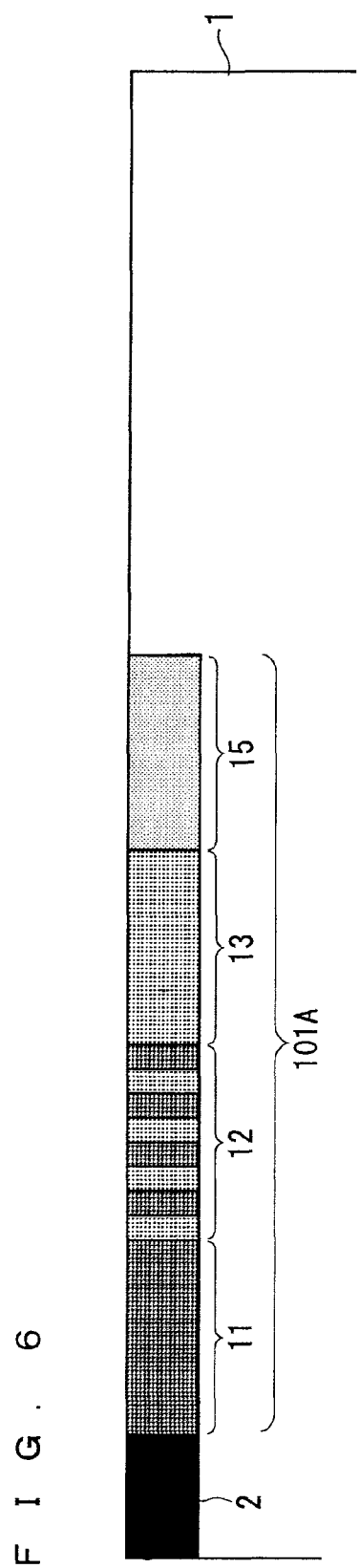
FIG. 6 A cross-sectional view showing a configuration of the semiconductor device according to the embodiment 1 of the present invention.

For example, in the RESURF layer 101A shown in FIG. 6, the third RESURF layer 13 and the fifth RESURF layer 15 are adjacent to each other, and a region (the fourth RESURF layer 14 in FIG. 5) defined by the effective implantation amount is not provided therebetween.

Similarly to the general RESURF structure, it may be acceptable that an N-type implantation layer (channel stopper) implanted with an N-type impurity at a relatively high concentration, which extends to a dicing line, is provided at a position outside and spaced apart from the RESURF layer 101. It may be acceptable that a field plate including a wiring layer and having the same potential as that of the channel stopper, which is for suppressing the stretch of the depletion layer having little electric field relief effect, is provided on a portion of the semiconductor substrate 1 located outside the RESURF layer 101. It may be acceptable that a field plate having the same potential as that of the P-type base, which is for further relieving the electric field in the peripheral portion of the P-type base 2, is provided so as to cover the peripheral portion of the P-type base 2 and part of the first RESURF layer 11. The effects thereof are not hindered by the present invention.

A-3. Modification 1

In the following, a configuration of and a method for manufacturing the termination region according to a modification 1 of the embodiment 1 will be described with reference to FIGS. 7 to 9.

Figure 7:
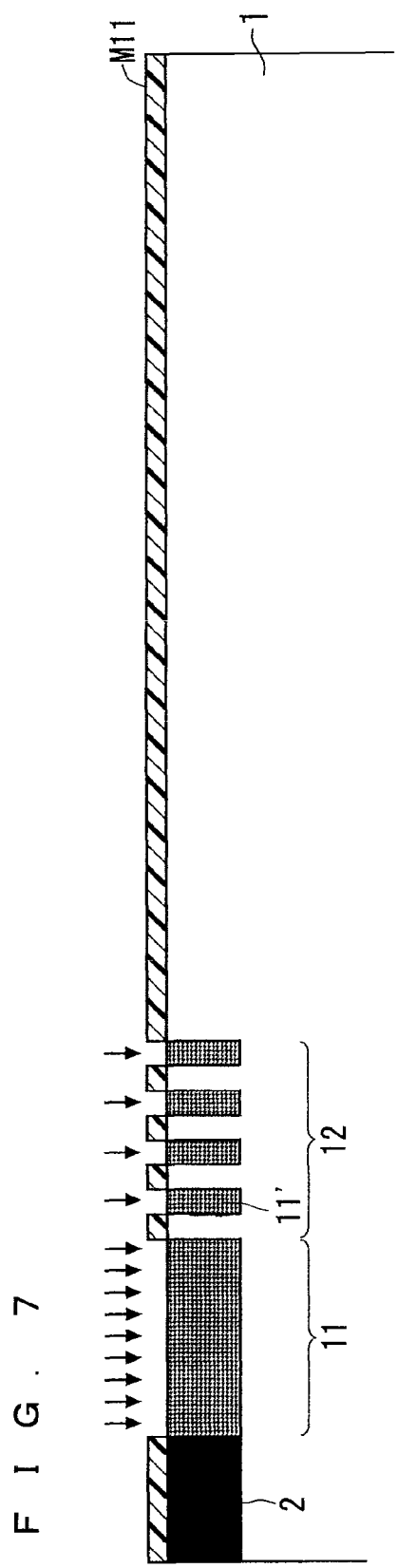
FIG. 7 A cross-sectional view showing a process of manufacturing a semiconductor device according to a modification 1 of the embodiment 1 of the present invention.
Figure 8:
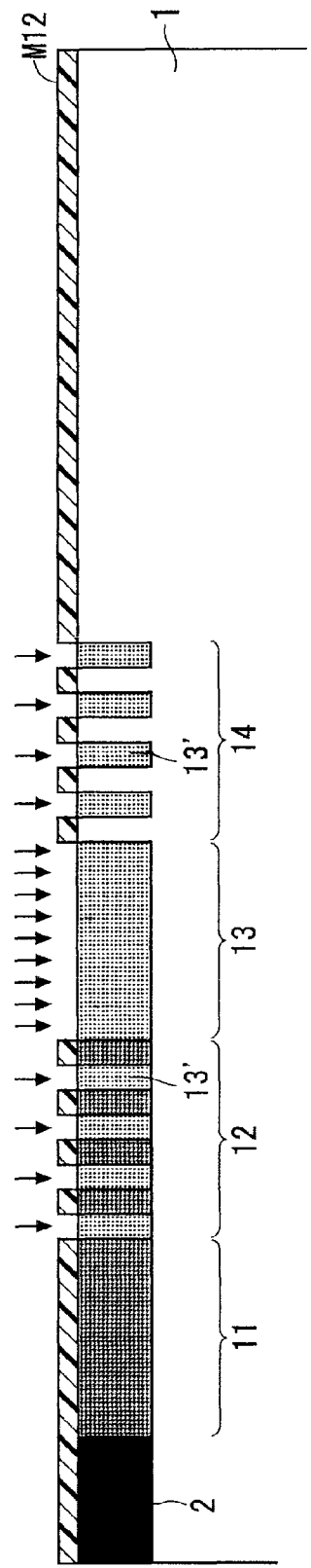
FIG. 8 A cross-sectional view showing the process of manufacturing the semiconductor device according to the modification 1 of the embodiment 1 of the present invention.
Figure 9:
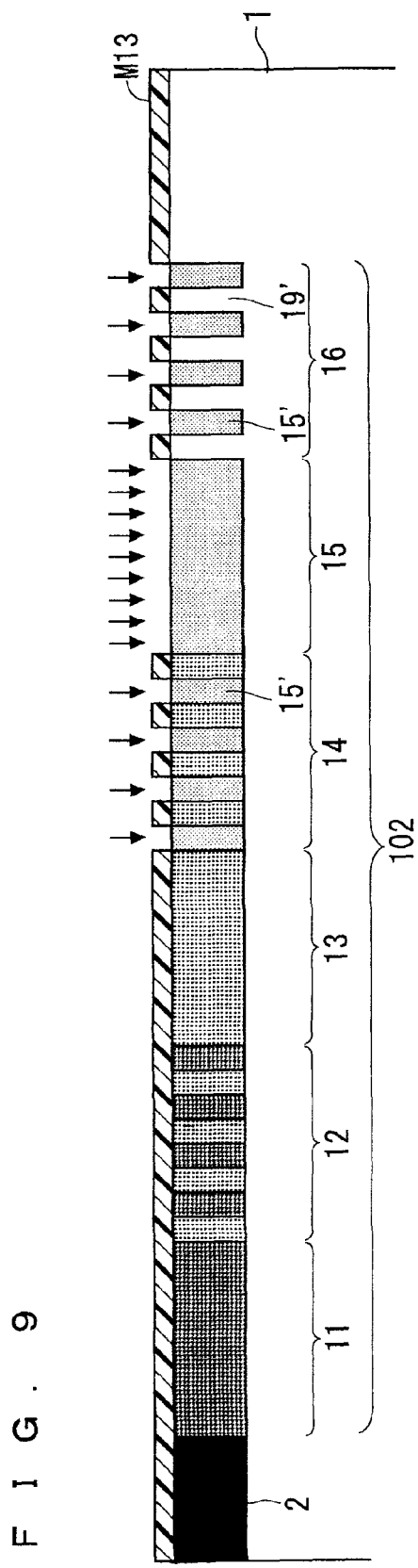
FIG. 9 A cross-sectional view showing the process of manufacturing the semiconductor device according to the modification 1 of the embodiment 1 of the present invention.

FIGS. 7 to 9 are cross-sectional views sequentially showing a process of manufacturing the termination region. A final configuration of the termination region is indicated as a RESURF layer 102 in FIG. 9 showing the final step.

A configuration of the RESURF layer 102 shown in FIG. 9 is the same as the configuration of the RESURF layer 101 shown in FIG. 5, except that a sixth RESURF layer 16 is additionally provided at the outer side of the fifth RESURF layer 15. The sixth RESURF layer 16 is configured with small regions 15' and small regions 19' being alternately arranged in multiple. The implantation amount in the small regions 15' is equal to that in the fifth RESURF layer 15. No ion implantation is performed in the small regions 19'. Due to such an arrangement, the sixth RESURF layer 16 is, in an effective sense, regarded as having an implantation amount lower than that in the fifth RESURF layer 15.

Next, a method for forming the RESURF layer 102 will be described with reference to FIGS. 7 to 9. Firstly, as shown in FIG. 7, an implantation mask M11 is patterned on the main surface on which the active region 2 has been formed.

The implantation mask M11 has a pattern in which portions corresponding to the first RESURF layer 11 and small regions 11' in the second RESURF layer 12 are opening. A P-type impurity, such as Al, is ion-implanted over the implantation mask M11, and thereby the entire first RESURF layer 11 and the small regions 11' in the second RESURF layer 12 are formed.

After the implantation mask M11 is removed, in step shown in FIG. 8, an implantation mask M12 is patterned. The implantation mask M12 has a pattern in which portions corresponding to small regions 13' in the second RESURF layer 12, the third RESURF layer 13, and small regions 13' in the fourth RESURF layer 14 are opening. A P-type impurity, such as Al, is ion-implanted over the implantation mask M12, and thereby the entire third RESURF layer 13 and the small regions 13' in the second RESURF layer 12 and the fourth RESURF layer 14 are formed.

Then, after the implantation mask M12 is removed, in step shown in FIG. 9, an implantation mask M13 is patterned.

The implantation mask M13 has a pattern in which portions corresponding to the fifth RESURF layer 15 and small regions 15' in the fourth RESURF layer 14 and in the sixth RESURF layer 16 are opening. A P-type impurity, such as Al, is ion-implanted over the implantation mask M13, and thereby the entire fifth RESURF layer 15 and the small regions 15' in the fourth RESURF layer 14 and in the sixth RESURF layer 16 are formed.

In this manner, through the three implantation processes, the RESURF layer 102 having six levels of implantation amounts in an effective sense is formed.

In the RESURF layer 102, the number of RESURF layers including an effective implantation amount is greater, by one, than that in the RESURF layer 101 shown in FIG. 5. Thus, the concentration of an electric field is further relieved.

The RESURF layer 102 shown in FIG. 9 has a width greater than that of the RESURF layer 101 shown in FIG. 5 by the width of the sixth RESURF layer 19. This is for ease of the description, and actually it is not necessary to change the width of the entire RESURF layer. It suffices that an internal region is divided into six parts to obtain the structure of the RESURF layer 102 as shown in FIG. 9.

Here, the RESURF layer 101 shown in FIG. 5 is connected to the P-type base 2. Thus, the potential of a neutral region in the RESURF layer 101 at a time when a reverse voltage bias is applied can be regarded as being equal to that of the P-type base 2. On the other hand, in the RESURF layer 102 shown in FIG. 9, the implantation layer (small regions 15') of the sixth RESURF layer 16 is not connected to the fifth RESURF layer 15. Thus, even when the voltage bias is zero, a region having a floating potential occurs in the implantation layer of the sixth RESURF layer 16 due to a diffusion potential. As a result, even when a reverse voltage bias is applied so that the depletion layer expands, carriers are kept confined in the implantation layer of the sixth RESURF layer 16. However, when the carriers are discharged to the outside due to diffusion of carriers and a recombination current in the depletion layer, the sixth RESURF layer 16 is also depleted similarly to the first to fifth RESURF layers 11 to 15 and functions as the RESURF structure. As for the second RESURF layer 12 and the fourth RESURF layer 14, too, it is possible that a situation occurs in which carriers are left surrounded by the depletion layer in the small region having a high implantation amount. In this case, due to the same mechanism as described above, the second RESURF layer 12 and the fourth RESURF layer 14 functions as the RESURF structure.

A-4. Modification 2

In the RESURF layers 101 and 102 shown in FIGS. 5 and 9, respectively, all the small regions included in the RESURF layer defined by the effective implantation amount have the same width. Instead, as in a RESURF layer 103 shown in FIG. 10, it may be also acceptable that, in the RESURF layer defined by the effective implantation amount, the small regions having a higher implantation amount have a constant width while the small regions having a lower implantation amount have the width thereof gradually increasing toward the outside of the device.

Figure 10:
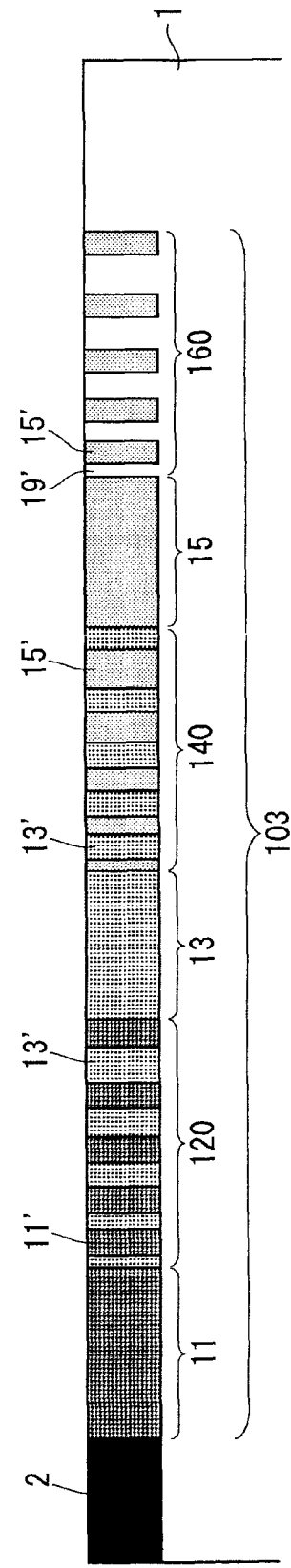
FIG. 10 A cross-sectional view showing a configuration of a semiconductor device according to a modification 2 of the embodiment 1 of the present invention.

That is, the RESURF layer 103 shown in FIG. 10 includes the first RESURF layer 11, a second RESURF layer 120, the third RESURF layer 13, the fourth RESURF layer 140, the fifth RESURF layer 15, and a sixth RESURF layer 160 that are arranged in the mentioned order from the P-type base 2 side and arranged so as to surround the P-type base 2.

The second RESURF layer 120 is configured with small regions 11' and small regions 13' being alternately arranged in multiple. The implantation amount in the small regions 11' is equal to that in the first RESURF layer 11. The implantation amount in the small regions 13' is equal to that in the third RESURF layer 13. The small regions 13' are configured such that the small region 13' adjacent to the first RESURF layer 11 has the smallest width and the small region 13' positioned farther from the first RESURF layer 11 has a greater width. The small regions 11' have a constant width.

The fourth RESURF layer 140 is configured with small regions 13' and small regions 15' being alternately arranged in multiple. The implantation amount in the small regions 13' is equal to that in the third RESURF layer 13. The implantation amount in the small regions 15' is equal to that in the fifth RESURF layer 15. The small regions 15' are configured such that the small region 15' adjacent to the third RESURF layer 13 has the smallest width and the small region 15' positioned farther from the third RESURF layer 13 has a greater width. The small regions 13' have a constant width.

The sixth RESURF layer 160 is configured with small regions 15' and small regions 19' being alternately arranged in multiple. The implantation amount in the small regions 15' is equal to that in the fifth RESURF layer 15. No ion implantation is performed in the small regions 19'. The small regions 19' are configured such that the small region 19' adjacent to the fifth RESURF layer 15 has the smallest width and the small region 19' positioned farther from the fifth RESURF layer 15 has a greater width. The small regions 15' have a constant width.

In the RESURF layer 103 configured as described above, regions each having a single implantation amount (the outside of the sixth RESURF is considered as a region having a single implantation amount that is zero) exist at both ends of the RESURF layer 103. Relative to these regions, the effective implantation amount can be gently changed. Thus, the concentration of an electric field is further relieved.

Figure 11:
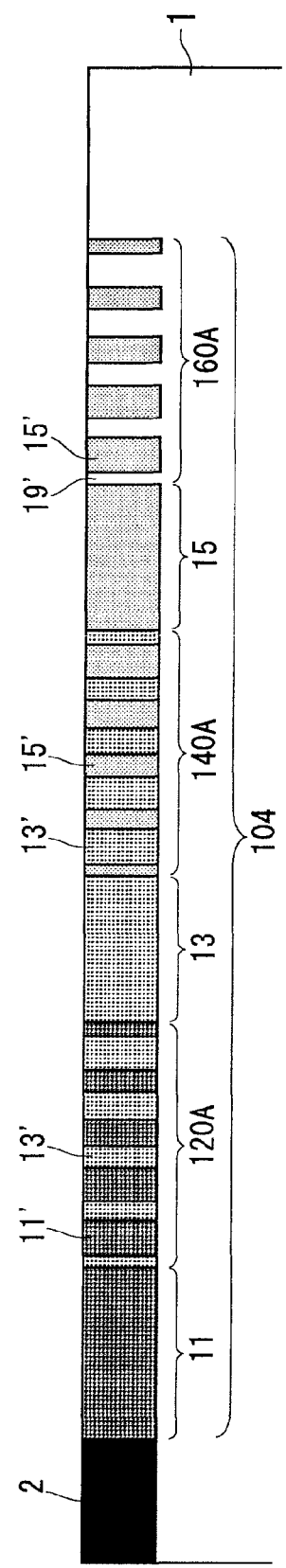
FIG. 11 A cross-sectional view showing the configuration of the semiconductor device according to the modification 2 of the embodiment 1 of the present invention.

As in a RESURF layer 104 shown in FIG. 11, it may be also acceptable that, in the RESURF layer defined by the effective implantation amount, the small regions having a higher implantation amount have the width thereof gradually decreasing toward the outside of the device while the small regions having a lower implantation amount have the width thereof gradually increasing toward the outside of the device.

That is, the RESURF layer 104 shown in FIG. 11 includes the first RESURF layer 11, a second RESURF layer 120A, the third RESURF layer 13, a fourth RESURF layer 140A, the fifth RESURF layer 15, and a sixth RESURF layer 160A that are arranged in the mentioned order from the P-type base 2 side and arranged so as to surround the P-type base 2.

The second RESURF layer 120A is configured with small regions 11' and small regions 13' being alternately arranged in multiple. The implantation amount in the small regions 11' is equal to that in the first RESURF layer 11. The implantation amount in the small regions 13' is equal to that in the third RESURF layer 13. The small regions 11' are configured such that the small region 11' closest to the first RESURF layer 11 has the greatest width and the small region 11' positioned farther from the first RESURF layer 11 has a smaller width. The small regions 13' are configured such that the small region 13' adjacent to the first RESURF layer 11 has the smallest width and the small region 13' positioned farther from the first RESURF layer 11 has a greater width.

The fourth RESURF layer 140A is configured with small regions 13' and small regions 15' being alternately arranged in multiple. The implantation amount in the small regions 13' is equal to that in the third RESURF layer 13. The implantation amount in the small regions 15' is equal to that in the fifth RESURF layer 15. The small regions 13' are configured such that the small region 13' closest to the third RESURF layer 13 has the greatest width and the small region 13' positioned farther from the third RESURF layer 13 has a smaller width. The small regions 15' are configured such that the small region 15' adjacent to the third RESURF layer 13 has the smallest width and the small region 15' positioned farther from the third RESURF layer 13 has a greater width.

The sixth RESURF layer 160A is configured with small regions 15' and small regions 19' being alternately arranged in multiple. The implantation amount in the small regions 15' is equal to that in the fifth RESURF layer 15. No ion implantation is performed in the small regions 19'. The small regions 15' are configured such that the small region 15' closest to the fifth RESURF layer 15 has the greatest width and the small region 15' positioned farther from the fifth RESURF layer 15 has a smaller width. The small regions 19' are configured such that the small region 19' adjacent to the fifth RESURF layer 15 has the smallest width and the small region 19' positioned farther from the fifth RESURF layer 15 has a greater width.

In the RESURF layer 104 configured as described above, regions each having a single implantation amount (the outside of the sixth RESURF is considered as a region having a single implantation amount that is zero) exist at both ends of the RESURF layer 104. Relative to these regions, the effective implantation amount can be further gently changed. Thus, the concentration of an electric field is still further relieved.

B. Embodiment 2

A configuration of a method for manufacturing the termination region according to an embodiment 2 of the present invention will be described with reference to FIGS. 12 and 13.

B-1. Device Configuration

Figure 12:
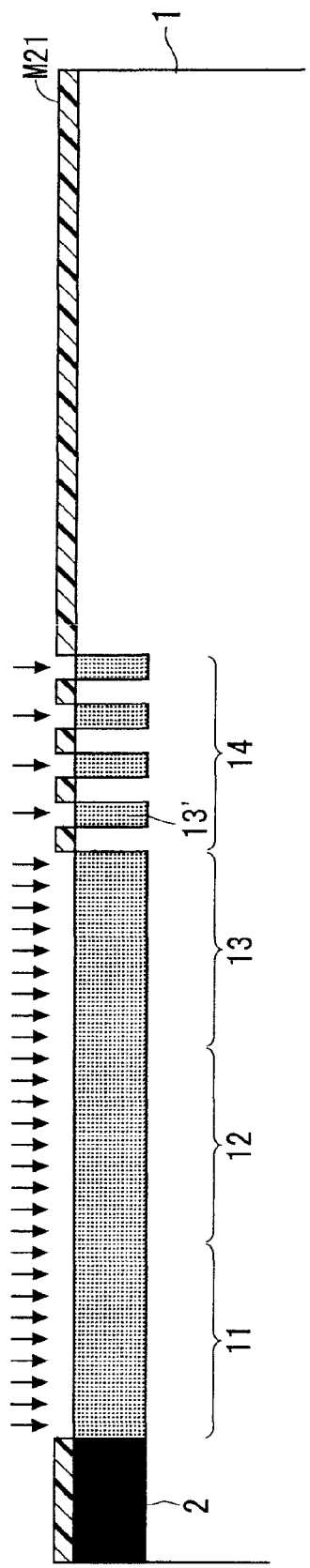
FIG. 12 A cross-sectional view showing a process of manufacturing a semiconductor device according to an embodiment 2 of the present invention.
Figure 13:
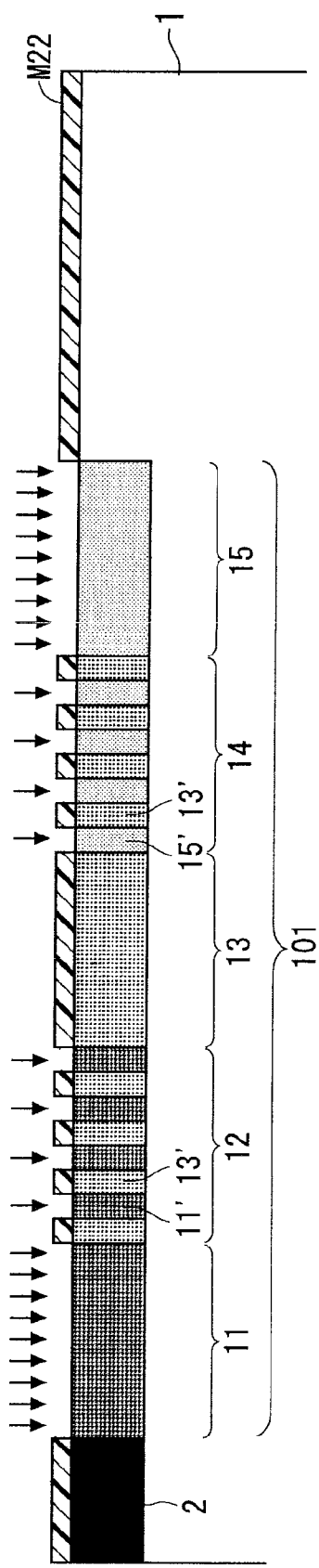
FIG. 13 A cross-sectional view showing the process of manufacturing the semiconductor device according to the embodiment 2 of the present invention.

FIGS. 12 and 13 are cross-sectional views sequentially showing a process of manufacturing the termination region. A final configuration of the termination region is indicated as a RESURF layer 101 in FIG. 13 showing the final step. In this embodiment, the configuration of the RESURF layer finally obtained is the same as the configuration of the RESURF layer 101 shown in FIG. 5 according to the embodiment 1, but a method for manufacturing the RESURF layer is different from that of the embodiment 1.

B-2. Manufacturing Method

In the following, a method for forming the RESURF layer 101 will be described with reference to FIGS. 12 and 13. Firstly, as shown in FIG. 12, an implantation mask M21 is patterned on the main surface where the active region 2 is formed.

The implantation mask M21 has a pattern in which portions corresponding to the first RESURF layer 11, the second RESURF layer 12, the third RESURF layer 13, and the small regions 13' in the fourth RESURF layer 14 are opening. A P-type impurity, such as Al, is ion-implanted over the implantation mask M21. Thereby, an implantation layer having an implantation amount equal to that in the third RESURF layer 13 is formed in a region corresponding to the first to third RESURF layers 11 to 13, while the small regions 13' are also formed in the fourth RESURF layer 14.

Then, after the implantation mask M21 is removed, in step shown in FIG. 13, an implantation mask M22 is patterned. The implantation mask M22 has a pattern in which portions corresponding to the first RESURF layer 11, the small regions 11' in the second RESURF layer 12, the small regions 15' in the fourth RESURF layer 14, and the fifth RESURF layer 15 are opening. A P-type impurity, such as Al, is ion-implanted over the implantation mask M22, and thereby the first RESURF layer 11, the second RESURF layer 12, the fourth RESURF layer 14, and the fifth RESURF layer 15 are formed. The third RESURF layer 13 is also obtained since the implantation mask M22 prevents a further implantation of an impurity therein.

Here, the RESURF layer 101 in which the implantation amount decreases stepwise cannot be obtained unless the implantation amount during the implantation process performed with use of the implantation mask M22 shown in FIG. 13 is less than the implantation amount during the implantation process performed with use of the implantation mask M21 shown in FIG. 12.

In this manner, through the two implantation processes, the RESURF layer 101 having five levels of implantation amounts in an effective sense is formed. That is, as compared with the manufacturing method according to the embodiment 1, the number of times each of the photolithography process and the impurity implantation process is performed can be reduced by one.

By the same method, a configuration identical to that of the RESURF layer 102 shown in FIG. 9 can be obtained. In the following, a method for forming the RESURF layer 102 will be described with reference to FIGS. 14 and 15.

Figure 14:
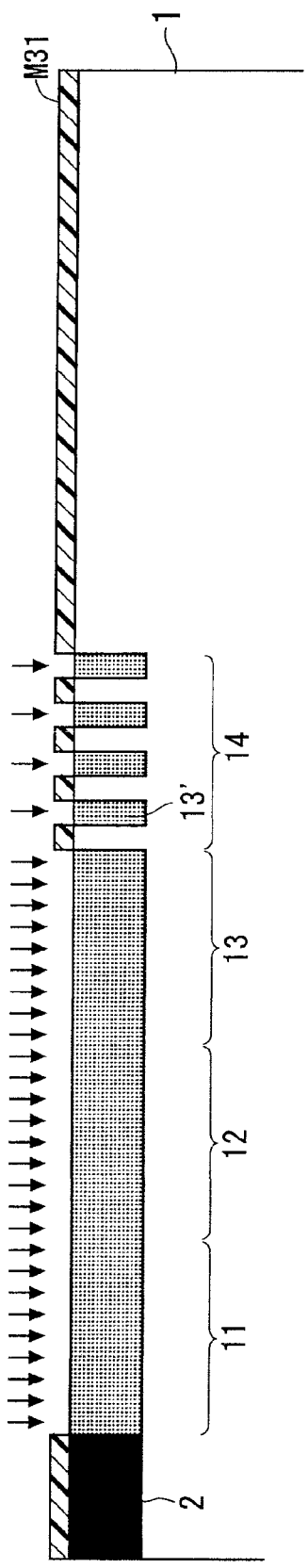
FIG. 14 A cross-sectional view showing the process of manufacturing the semiconductor device according to the embodiment 2 of the present invention.

Firstly, as shown in FIG. 14, an implantation mask M31 is patterned on the main surface where the active region 2 is formed.

The implantation mask M31 has a pattern in which portions corresponding to the first RESURF layer 11, the second RESURF layer 12, the third RESURF layer 13, and the small regions 13' in the fourth RESURF layer 14 are opening. A P-type impurity, such as Al, is ion-implanted over the implantation mask M31. Thereby, an implantation layer having an implantation amount equal to that in the third RESURF layer 13 is formed in a region corresponding to the first to third RESURF layers 11 to 13, while the small regions 13' are also formed in the fourth RESURF layer 14.

Figure 15:
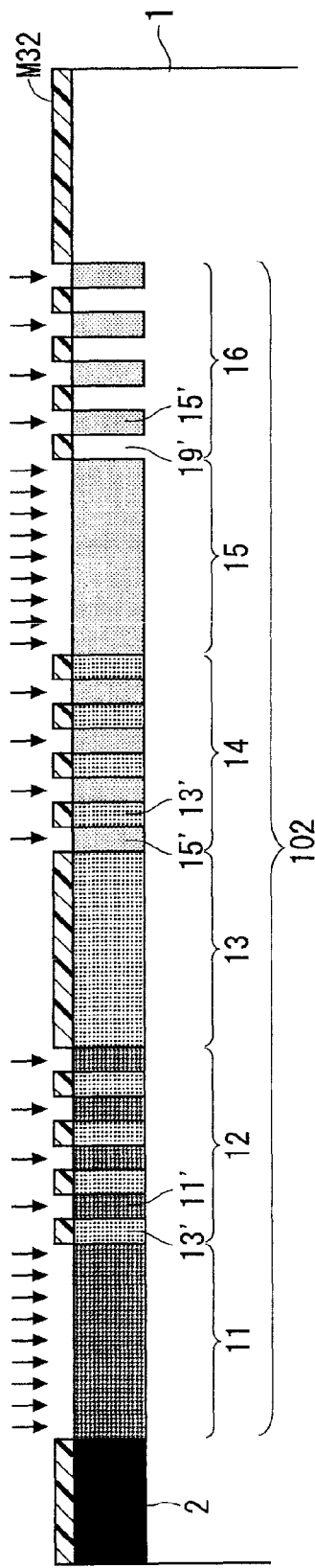
FIG. 15 A cross-sectional view showing the process of manufacturing the semiconductor device according to the embodiment 2 of the present invention.

Then, after the implantation mask M31 is removed, in step shown in FIG. 15, an implantation mask M32 is patterned. The implantation mask M32 has a pattern in which portions corresponding to the first RESURF layer 11, the small regions 11' in the second RESURF layer 12, the small regions 15' in the fourth RESURF layer 14, the fifth RESURF layer 15, and the small regions 15' in the sixth RESURF layer 16 are opening. A P-type impurity, such as Al, is ion-implanted over the implantation mask M32, and thereby the first RESURF layer 11, the second RESURF layer 12, the fourth RESURF layer 14, and the fifth RESURF layer 15 are formed. The third RESURF layer 13 is also obtained since the implantation mask M32 prevents a further implantation of an impurity therein.

Here, the RESURF layer 102 in which the implantation amount decreases stepwise cannot be obtained unless the implantation amount during the implantation process performed with use of the implantation mask M32 shown in FIG. 15 is less than the implantation amount during the implantation process performed with use of the implantation mask M31 shown in FIG. 14.

In this manner, through the two implantation processes, the RESURF layer 102 having a five levels of implantation amounts in an effective sense is formed. That is, as compared with the manufacturing method according to the embodiment 1, the number of times each of the photolithography process and the impurity implantation process is performed can be reduced by one.

In the above-described manufacturing method, the implantation amount in the first RESURF layer 11 having the highest implantation amount is determined by the sum of the implantation amount in the third RESURF layer 13 and the implantation amount in the fifth RESURF layer 15. This limitation causes no problem, for the following reasons.

In the following, the implantation amounts in the first to sixth RESURF layers 11 to 16 will be described using, as an example, the method described with reference to FIGS. 14 and 15.

Here, a case where the semiconductor substrate 1 is a SiC substrate having a polytype of 4H is assumed. When the implantation amount (implantation surface density) during the implantation process performed with use of the implantation mask M32 is $0.5 \times 10^{13}$ cm$^{-2}$ and the implantation amount during the implantation process performed with use of the implantation mask M31 is $1.0 \times 10^{13}$ cm$^{-2}$, the implantation amounts or effective implantation amounts in the first to sixth RESURF layers 11 to 19 are, from that in the first RESURF layer 11, $1.5 \times 10^{13}$ cm$^{-2}$, $1.25 \times 10^{13}$ cm$^{-2}$, $1.0 \times 10^{13}$ cm$^2$, $0.75 \times 10^{13}$ cm$^{-2}$, $0.5 \times 10^{13}$ cm$^{-2}$, and $0.25 \times 10^{13}$ cm$^{-2}$, respectively. Here, assuming that the first to sixth RESURF layers 11 to 16 have substantially the same width, the implantation amount in the RESURF layer 102 decreases stepwise linearly to zero toward the outside.

A RESURF layer in which the implantation amount decreases stepwise linearly to zero toward the outside is effective in obtaining high breakdown voltage performance and improving the reliability of the operation of the device. Accordingly, there would be no disadvantage in the fact that the implantation amount in the first RESURF layer 11 is determined by the sum of the implantation amount in the third RESURF layer 13 and the implantation amount in the fifth RESURF layer 15.

For example, when the concentration of the N-type impurity in the SiC substrate 1 is $3 \times 10^{15}$ cm$^{-3}$ and the width of each of the first to sixth RESURF layers 11 to 16 having the above-described implantation amounts is 25 μm (the width of the entire RESURF layer is 150 μm), a breakdown voltage of 4000V or higher is obtained while an electric field in a most superficial surface of the RESURF layer is suppressed to 1 MV/cm or less.

In the RESURF layer 101 shown in FIG. 13, when the same implantation conditions as described above are adopted except that the widths of the first to fourth RESURF layers 11 to 14 are substantially the same while the width of the fifth RESURF layer 15 is about 1.5 times the width of the other layers, the RESURF layer 101 shown in FIG. 13 can be approximately regarded as a RESURF layer in which the implantation amount decreases stepwise linearly to zero toward the outside.

Here, a result of a simulation of a distribution of the electric field intensity at a reverse voltage of 4000V is shown in FIGS. 36 and 37. FIG. 36 shows the electric field intensity (V/cm) in a most superficial surface (the most superficial surface of the RESURF layer) of the substrate. The horizontal axis represents a distance (μm) of each of the RESURF layer, the P-type base, and the low concentration N-type semiconductor substrate in a plane direction. The vertical axis represents the electric field intensity (V/cm). In FIG. 37, the horizontal axis represents the distance (μm) in the plane direction, and the vertical axis represents the electric field intensity (V/cm). The distance in the plane direction shown in FIG. 37 is the same as that shown in FIG. 36. However, FIG. 37 shows the distribution of the electric field intensity at a depth (PN junction depth), corresponding to the depth of implantation in the P-type base and the RESURF layer, from the most superficial surface (the most superficial surface of the RESURF layer) of the substrate.

In FIGS. 36 and 37, the solid line indicates the distribution of an electric field intensity obtained in the RESURF layer having the structure according to the present invention, and the broken line indicates the distribution of an electric field intensity in an ideal structure (structure in which the second RESURF layer 12, the fourth RESURF layer 14, and the sixth RESURF layer 16 have a single implantation amount). FIGS. 36 and 37 reveal that structure of the present invention effectively suppresses the electric field in the most superficial surface of the RESURF layer. FIGS. 36 and 37 also reveal that averaging the distribution of the electric field intensity in the structure of the present invention results in a distribution of an electric field intensity that is extremely close to that in an ideal structure.

At a reverse voltage of 4000V, in both the structure of the present invention and the ideal structure, a maximum electric field occurs at the PN junction depth in the peripheral portion of the P-type base. This portion is identical to a portion where an electric field concentrates in a case where the RESURF layer is not provided.

B-3. Modification 1

In the embodiment 2 described above, the same depth of implantation is adopted in the two implantation processes. Instead, the depth of implantation may be changed between the implantation processes. In the following, a configuration of and a method for manufacturing the termination region according to a modification 1 of the embodiment 2 will be described with reference to FIGS. 16 and 17.

Figure 16:
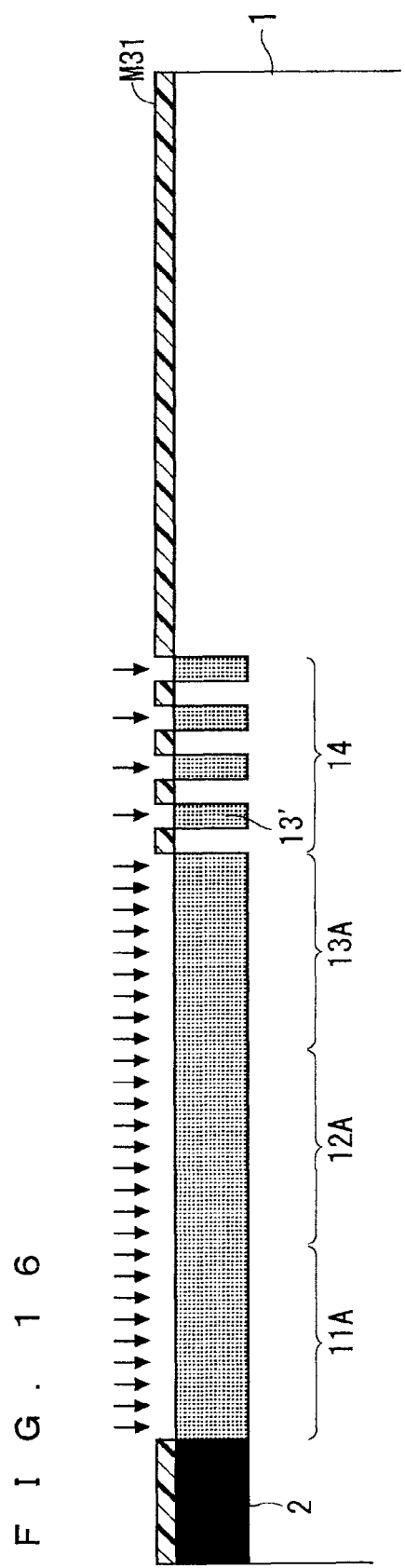
FIG. 16 A cross-sectional view showing a process of manufacturing a semiconductor device according to a modification 1 of the embodiment 2 of the present invention.
Figure 17:
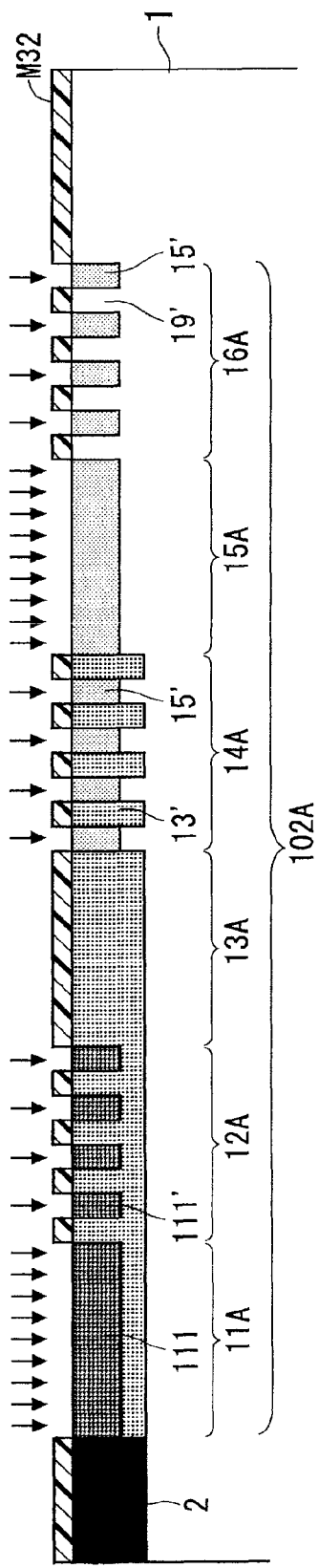
FIG. 17 A cross-sectional view showing the process of manufacturing the semiconductor device according to the modification 1 of the embodiment 2 of the present invention.

FIGS. 16 and 17 are cross-sectional views sequentially showing a process of manufacturing the termination region. A final configuration of the termination region is indicated as a RESURF layer 102A in FIG. 17 showing the final step.

The RESURF layer 102A includes a first RESURF layer 11A, a second RESURF layer 12A, a third RESURF layer 13A, a fourth RESURF layer 14A, a fifth RESURF layer 15A, and a sixth RESURF layer 16A that are arranged in the mentioned order from the P-type base 2 side and arranged so as to surround the P-type base 2.

The first RESURF layer 11A is configured such that an impurity layer 111 inside first RESURF layer, which is less deep than the third RESURF layer 13A, is contained within an implantation layer having an implantation amount and a depth equal to those of the third RESURF layer 13A.

The second RESURF layer 12A is configured such that small regions 111' having an implantation amount and a depth equal to those of the impurity layer 111 inside first RESURF layer are arranged at predetermined intervals within an implantation layer having an implantation amount and a depth equal to those of the third RESURF layer 13A.

The fourth RESURF layer 14A is configured with small regions 13' and small regions 15' being alternately arranged in multiple. The small regions 13' have an implantation amount and a depth equal to those of the third RESURF layer 13A. The small regions 15' have an implantation amount and a depth equal to those of the fifth RESURF layer 15A.

The sixth RESURF layer 16A is configured with small regions 15' and small regions 19' being alternately arranged in multiple. The small regions 15' have an implantation amount and a depth equal to those of the fifth RESURF layer 15A. No ion implantation is performed in the small regions 19'.

Adoption of such a configuration enables the change in the concentration in the first RESURF layer 11A and the second RESURF layer 12A to be gentle in a depth direction. As a result, the concentration of an electric field in the first RESURF layer 11A and the second RESURF layer 12A is relieved.

Next, a method for forming the RESURF layer 102A will be described with reference to FIGS. 16 and 17. Firstly, as shown in FIG. 16, an implantation mask M31 is patterned on the main surface where the active region 2 is formed.

The implantation mask M31 has a pattern in which portions corresponding to the first RESURF layer 11A, the second RESURF layer 12A, and the third RESURF layer 13A and portions corresponding to the small regions 13' in the fourth RESURF layer 14A are opening. A P-type impurity, such as Al, is ion-implanted over the implantation mask M31. Thereby, an implantation layer having an implantation amount and a depth equal to those of the third RESURF layer 13A is formed in a region corresponding to the first to third RESURF layers 11A to 13A, while the small regions 13' are formed in the fourth RESURF layer 14A. In this case, the depth of implantation in the third RESURF layer 13A is made equivalent to the depth of implantation in the P-type base 2.

Then, after the implantation mask M31 is removed, in step shown in FIG. 17, an implantation mask M32 is patterned. The implantation mask M32 has a pattern in which portions corresponding to the first RESURF layer 11A, the small regions 111' in the second RESURF layer 12A, the small regions 15' in the fourth RESURF layer 14A, the fifth RESURF layer 15A, and the small regions 15' in the sixth RESURF layer 16A are opening. A P-type impurity, such as Al, is ion-implanted over the implantation mask M32, with implantation energy lower than that in the implantation process performed with use of the implantation mask M31. Thereby, the impurity layer 111 inside first RESURF layer, the small regions 111', the small regions 15', the fifth RESURF layer 15A, and the small regions 15' are formed. Thus, the first RESURF layer 11A, the second RESURF layer 12A, the fourth RESURF layer 14A, the fifth RESURF layer 15A, and the sixth RESURF layer 16A are formed. The third RESURF layer 13A is obtained since the implantation mask M32 prevents a further implantation of an impurity therein.

B-4. Modification 2

Figure 18:
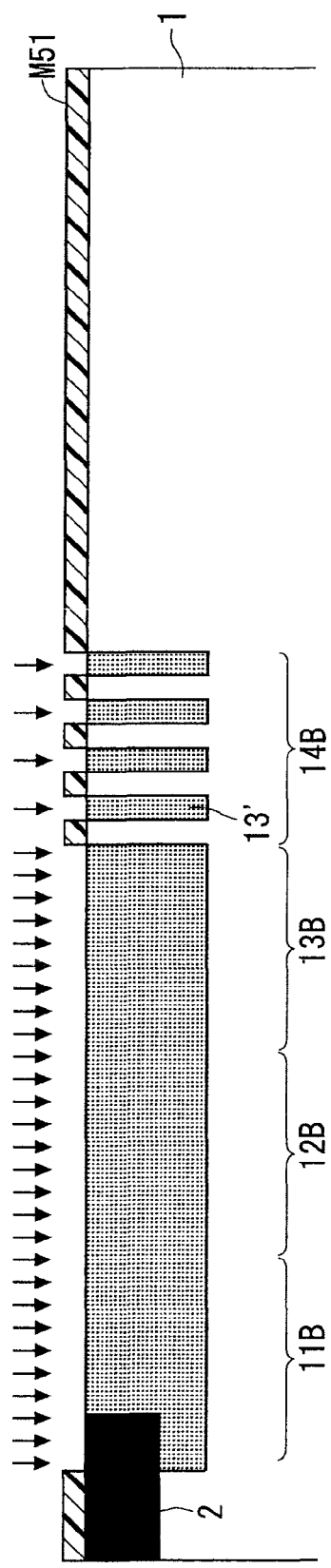
FIG. 18 A cross-sectional view showing a configuration of a semiconductor device according to a modification 2 of the embodiment 2 of the present invention.
Figure 19:
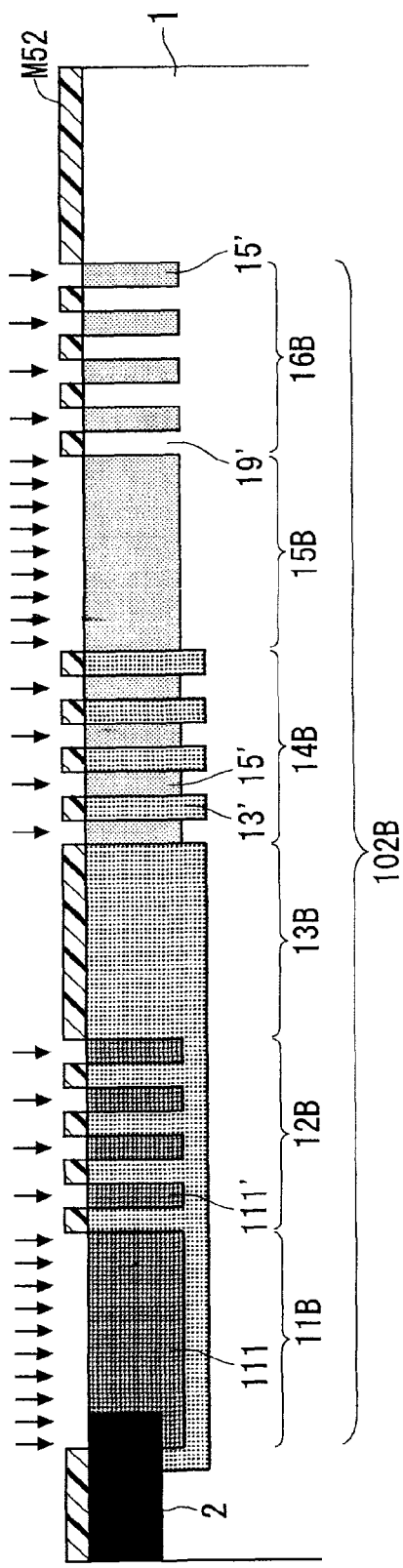
FIG. 19 A cross-sectional view showing the configuration of the semiconductor device according to the modification 2 of the embodiment 2 of the present invention.

A method shown in FIGS. 18 and 19 is also adoptable as the method for changing the depth of implantation between the implantation processes.

FIGS. 18 and 19 are cross-sectional views sequentially showing a process of manufacturing the termination region. A final configuration of the termination region is indicated as a RESURF layer 102B in FIG. 19 showing the final step.

The RESURF layer 102B includes a first RESURF layer 11B, a second RESURF layer 12B, a third RESURF layer 13B, a fourth RESURF layer 14B, a fifth RESURF layer 15B, and a sixth RESURF layer 16B that are arranged in the mentioned order from the P-type base 2 side and arranged so as to surround the P-type base 2.

The first RESURF layer 11B is configured such that an impurity layer 111 inside first RESURF layer, which is less deep than the third RESURF layer 13B, is contained within an implantation layer having an implantation amount and a depth equal to those of the third RESURF layer 13B.

The second RESURF layer 12B is configured such that small regions 111' having an implantation amount and a depth equal to those of the impurity layer 111 inside first RESURF layer are arranged at predetermined intervals within an implantation layer having an implantation amount and a depth equal to those of the third RESURF layer 13B.

The fourth RESURF layer 14B is configured with small regions 13' and small regions 15' being alternately arranged in multiple. The small regions 13' have an implantation amount and a depth equal to those of the third RESURF layer 13B. The small regions 15' have an implantation amount and a depth equal to those of the fifth RESURF layer 15B.

The sixth RESURF layer 16B is configured with small regions 15' and small regions 19' being alternately arranged in multiple. The small regions 15' have an implantation amount and a depth equal to those of the fifth RESURF layer 15B. No ion implantation is performed in the small regions 19'.

In the RESURF layer 102B, the first RESURF layer 11B overlaps the P-type base 2 in a width direction and a depth direction. Therefore, in a corner portion of the P-type base 2 near the first RESURF layer 11B, the change in the concentration in the depth direction is made gentle. As a result, the concentration of an electric field is relieved also in the corner portion of the P-type base 2 near the RESURF layer 11B.

Next, a method for forming the RESURF layer 102B will be described with reference to FIGS. 18 and 19. Firstly, as shown in FIG. 18, an implantation mask M51 is patterned on the main surface where the active region 2 is formed.

The implantation mask M51 has a pattern in which portions corresponding to the first RESURF layer 11B, the second RESURF layer 12B, and the third RESURF layer 13B and portions corresponding to the small regions 13' in the fourth RESURF layer 14B are opening. A P-type impurity, such as Al, is ion-implanted over the implantation mask M51. Thereby, an implantation layer having an implantation amount and a depth equal to those of the third RESURF layer 13B is formed in a region corresponding to the first to third RESURF layers 11B to 13B, while the small regions 13' are formed in the fourth RESURF layer 14B. In this case, the implantation energy is set such that the depth of implantation of the implantation layer having an implantation amount and a depth equal to those of the third RESURF layer 13B is greater than the depth of implantation of the P-type base 2. The openings of the implantation mask M51 are formed so as to overlap the P-type base 2 with respect to the width direction.

Then, after the implantation mask M51 is removed, in step shown in FIG. 19, an implantation mask M52 is patterned. The implantation mask M52 has a pattern in which portions corresponding to the impurity layer 111' in the second RESURF layer 12B, the small regions 15' in the fourth RESURF layer 14B, the fifth RESURF layer 15B, and the small regions 15 in the sixth RESURF layer 16B are opening. In this case, the opening for the formation of the impurity layer 111 inside first RESURF layer is made overlap the P-type base 2 with respect to the width direction, but not beyond a region where the implantation layer having an implantation amount and a depth equal to those of the third RESURF layer 13B overlaps the P-type base 2 with respect to the width direction.

Then, a P-type impurity, such as Al, is ion-implanted over the implantation mask M52 with implantation energy lower than that in the implantation process performed with use of the implantation mask M51. Thereby, the impurity layer 111 inside first RESURF layer, the small regions 111', the small regions 15', the fifth RESURF layer 15B, and the small regions 15' are formed. Thus, the first RESURF layer 11B, the second RESURF layer 12B, the fourth RESURF layer 14B, the fifth RESURF layer 15B, and the sixth RESURF layer 16B are formed. The third RESURF layer 13B is obtained since the implantation mask M52 prevents a further implantation of an impurity therein. In this case, the implantation energy is set such that the depth of implantation of the impurity layer 111 inside first RESURF layer is greater than that of the P-type base 2.

B-5. Modification 3

In a case of the diode 100 in which the active region is constituted only by the P-type base 2 as shown in FIG. 1, the implantation of the RESURF layer may be performed over the entire P-type base 2. This method will be described with reference to FIGS. 20 and 21.

Figure 20:
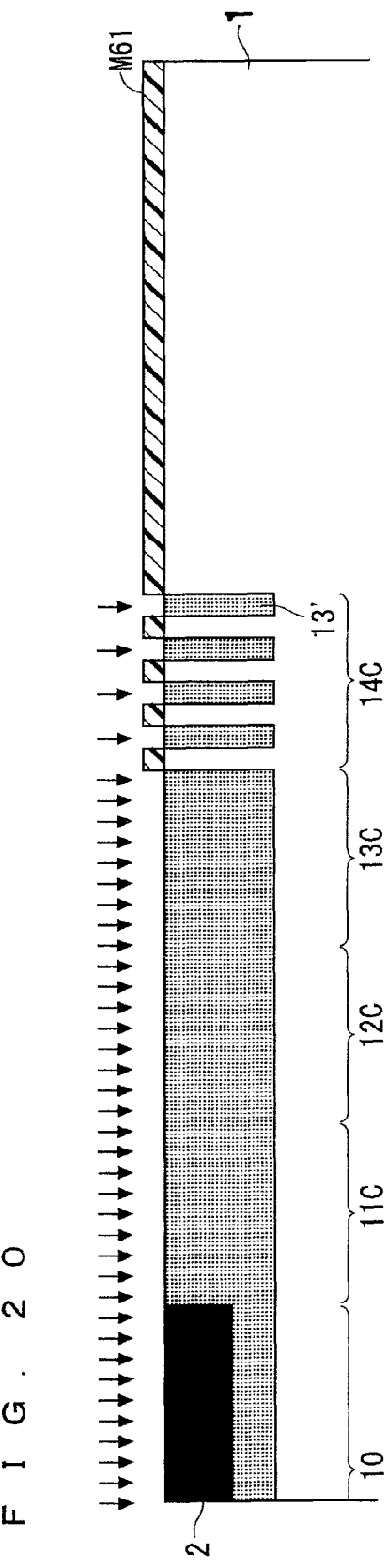
FIG. 20 A cross-sectional view showing a configuration of a semiconductor device according to a modification 3 of the embodiment 2 of the present invention.
Figure 21:
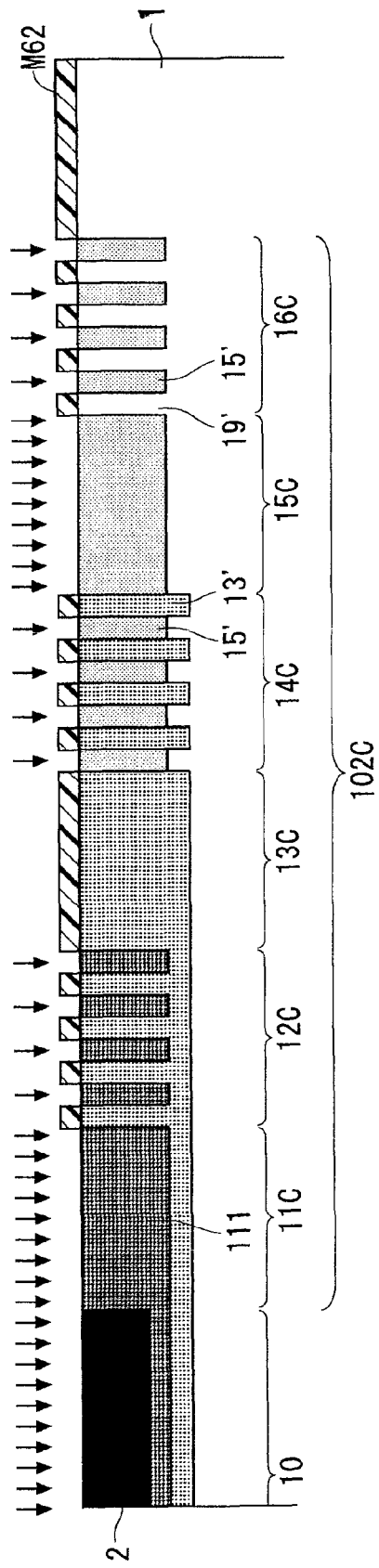
FIG. 21 A cross-sectional view showing the configuration of the semiconductor device according to the modification 3 of the embodiment 2 of the present invention.

FIGS. 20 and 21 are cross-sectional views sequentially showing a process of manufacturing the termination region. A final configuration of the termination region is indicated as a RESURF layer 102C in FIG. 21 showing the final step.

The RESURF layer 102C includes an active region RESURF layer 10 extending over the entire P-type base 2, a first RESURF layer 11C, a second RESURF layer 12C, a third RESURF layer 13C, a fourth RESURF layer 14C, a fifth RESURF layer 15C, and a sixth RESURF layer 16C that are arranged in the mentioned order from the P-type base 2 side and arranged so as to surround the P-type base 2.

The first RESURF layer 11C is configured such that an impurity layer 111 inside first RESURF layer, which is less deep than the third RESURF layer 13C, is contained within an implantation layer having an implantation amount and a depth equal to those of the third RESURF layer 13C.

The second RESURF layer 12C is configured such that small regions 111' having an implantation amount and a depth equal to those of the impurity layer 111 inside first RESURF layer are arranged at predetermined intervals within an implantation layer having an implantation amount and a depth equal to those of the third RESURF layer 13C.

The fourth RESURF layer 14C is configured with small regions 13' and small regions 15' being alternately arranged in multiple. The small regions 13' have an implantation amount and a depth equal to those of the third RESURF layer 13C. The small regions 15' have an implantation amount and a depth equal to those of the fifth RESURF layer 15C.

The sixth RESURF layer 16C is configured with small regions 15' and small regions 19' being alternately arranged in multiple. The small regions 15' have an implantation amount and a depth equal to those of the fifth RESURF layer 15C. No ion implantation is performed in the small regions 19'.

In the RESURF layer 102C, the impurity layer 111 inside first RESURF layer is provided so as to contain the entire P-type base 2 therein, and the implantation layer having an implantation amount and a depth equal to those of the third RESURF layer 13C is provided so as to contain the impurity layer 111 inside first RESURF layer therein. A region where the P-type base 2 is contained is called the active region RESURF layer 10.

Adoption of such a configuration enables the change in the concentration in the entire P-type base 2 to be gentle in the depth direction. Thereby, switching characteristics of the PN diode can be changed.

Next, a method for forming the RESURF layer 102C will be described with reference to FIGS. 20 and 21. Firstly, as shown in FIG. 20, an implantation mask M61 is patterned on the main surface where the active region 2 is formed.

The implantation mask M61 has a pattern in which portions corresponding to the P-type base 2, the first RESURF layer 11C, the second RESURF layer 12C, and the third RESURF layer 13C and portions corresponding to the small regions 13' in the fourth RESURF layer 14C are opening. A P-type impurity, such as Al, is ion-implanted over the implantation mask M61. Thereby, an implantation layer having an implantation amount and a depth equal to those of the third RESURF layer 13C is formed in a region corresponding to the active region RESURF layer 10 and the first to third RESURF layers 11C to 13C, while the small regions 13' are formed in the fourth RESURF layer 14C. In this case, the implantation energy is set such that the depth of implantation of the implantation layer having an implantation amount and a depth equal to those of the third RESURF layer 13C is greater than the depth of implantation of the P-type base 2.

Then, after the implantation mask M61 is removed, in step shown in FIG. 21, an implantation mask M62 is patterned. The implantation mask M62 has a pattern in which portions corresponding to the impurity layer 111 inside first RESURF layer, the small regions 111' in the second RESURF layer 12C, the small regions 15' in the fourth RESURF layer 14C, the fifth RESURF layer 15C, and the small regions 15' in the sixth RESURF layer 16C are opening. In this case, the opening for the formation of the impurity layer 111 inside first RESURF layer extends over the entire P-type base 2.

Then, a P-type impurity, such as Al, is ion-implanted over the implantation mask M62 with implantation energy lower than that in the implantation process performed with use of the implantation mask M61. Thereby, the impurity layer 111 inside first RESURF layer, the small regions 111', the small regions 15', the fifth RESURF layer 15C, and the small regions 15' are formed. Thus, the active region RESURF layer 10, the first RESURF layer 11C, the second RESURF layer 12C, the fourth RESURF layer 14C, the fifth RESURF layer 15C, and the sixth RESURF layer 16C are formed. The third RESURF layer 13C is obtained since the implantation mask M62 prevents a further implantation of an impurity therein. In this case, the implantation energy is set such that the depth of implantation of the impurity layer 111 inside first RESURF layer is greater than that of the P-type base 2.

In the methods shown in the modifications 1 to 3 of the embodiment 2 described above, the depth of implantation is changed among the implantation processes to thereby control the RESURF structure and furthermore the profile of the active region in the depth direction. These methods are particularly effective in a case of using a semiconductor substrate, such as a SiC substrate, in which scattering and diffusion of impurity ions are small. Even in a case of using a semiconductor substrate, such as a silicon substrate, that causes large thermal diffusion, these methods are applicable in order to shorten an annealing treatment time period or to lower the annealing temperature.

In the configurations shown in the modifications 2 and 3, as a result of changing the depth of implantation among the implantation processes, the first RESURF layer 11B overlaps the P-type base 2 in the width direction and the depth direction, or the entire P-type base 2 is contained in the impurity layer 111 inside first RESURF layer. Here, in a case where the depth of implantation is constant, an impurity region of the first RESURF layer adjacent to the P-type base 2 (active region) may be configured as described above. Particularly in a case of the modification 3, it may be acceptable to omit the implantation process for the P-type base layer 2 so that the impurity layer 111 inside first RESURF layer (that is, the active region RESURF layer 10 and the first RESURF layer 11C) is regarded as a P-type base. It is desirable that the total implantation amount in a region serving as the P-type base is at least one to two times the value that is given by RESURF conditions of the semiconductor material (conditions under which the P-type base is not completely depleted). In this configuration, the number of times each of the photolithography process and the impurity implantation process is performed for manufacturing the PN junction diode can be reduced by one C. Embodiment 3

The embodiment 2 has described the configuration of and the method for manufacturing the RESURF layer in which the effective implantation amount progressively decreases in five levels or six levels toward the outside of the semiconductor device, obtained through the two implantation processes. This can be formulated into n implantation processes. n is at least two. Hereinafter, in an embodiment 3 of the present invention, a configuration of and a method for manufacturing a RESURF layer through the n implantation process will be described.

In a case of performed the n implantation processes, the implantation amounts a1, a2, a3, ..., an satisfy the following relationship.

[Math. 1]

$$a(k+1)=ak/2 (1 \leq k \leq n-1) \quad (1)$$

This expression (1) can be rewritten as the following mathematical expression (2).

[Math. 2]

$$am=a1/2^{m-1} (1 \leq m \leq n) \quad (2)$$

The number of kinds of the implantation amount that can be achieved by these n implantation processes, that is, the number of kinds of the implantation amount that can be expressed as the sum of one or more from a1, ... an, is $(2^n-1)$. In this stage, the effective implantation amount is not yet considered.

This implantation amount sj is represented by the following mathematical expression (3).

[Math. 3]

$$sj=a1 \times j/2^{n-1} (1 \leq j \leq 2^n-1) \quad (3)$$

In other words, in a range of the implantation amount $s(2^n-1)=a1 \times (2^n-1)/2^{n-1}$ to $s1=a1/2^{n-1}$, implantation amounts that are discrete and at regular intervals are obtained. Then, a region having an implantation amount of $s(2^n-1)$ is arranged adjacent to the P-type base 2. Then, a region having an implantation amount of $s(2^n-2)$ is arranged adjacent to the outside of the region having an implantation amount of $s(2^n-1)$. In this manner, the implantation amount sj is gradually reduced toward the outside. Finally, a region having an implantation amount of s1 is arranged. Thereby, through the n implantation processes, a RESURF layer having $(2^n-1)$ levels of implantation amounts is formed. Then, by making the width of all the regions having the implantation amount sj equal to one another, a RESURF layer having ($2^n-1$) levels of implantation amounts in which the implantation amount decreases stepwise linearly to zero toward the outside.

C-1. Device Configuration 1

Here, an example case of n=3 will be described with reference to FIGS. 22 to 24. Based on the above-described theory, a RESURF layer having seven levels of implantation amounts is obtained through three implantation processes.

Figure 22:
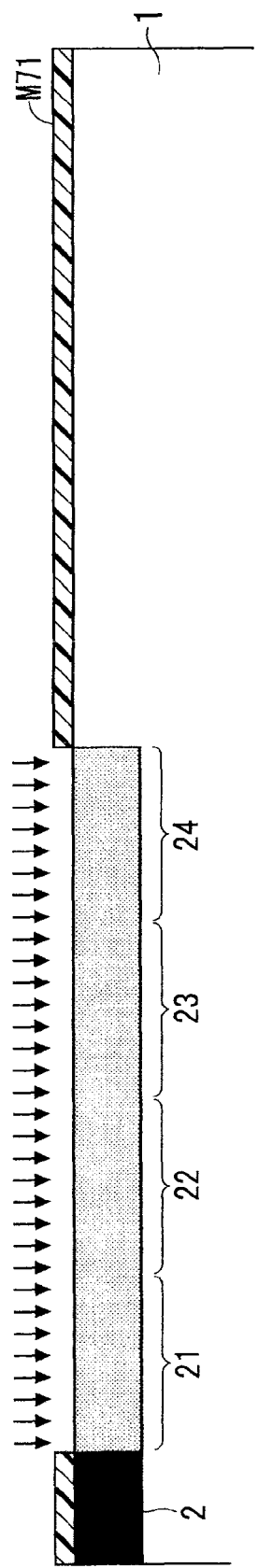
FIG. 22 A cross-sectional view showing a process of manufacturing a semiconductor device according to an embodiment 3 of the present invention.
Figure 23:
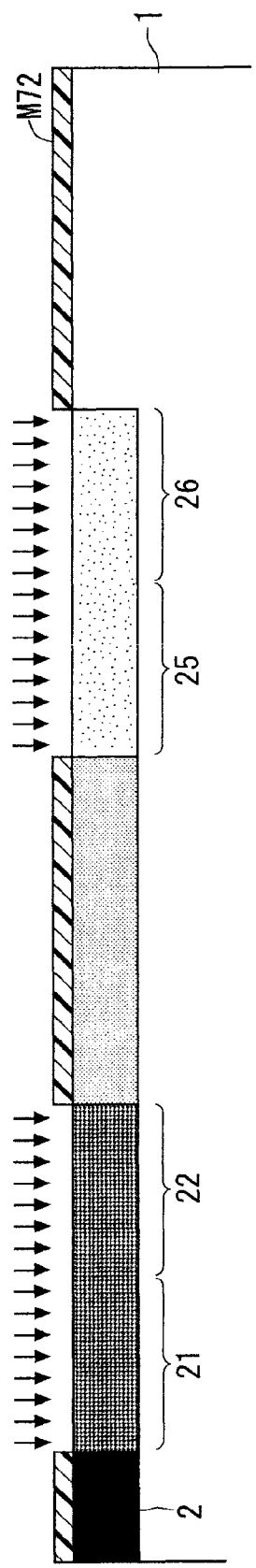
FIG. 23 A cross-sectional view showing the process of manufacturing the semiconductor device according to the embodiment 3 of the present invention.
Figure 24:
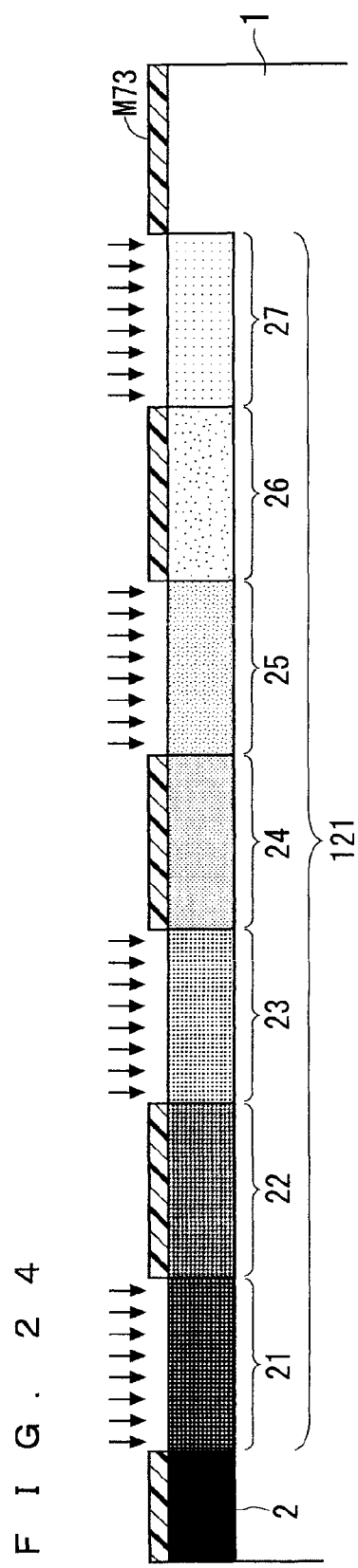
FIG. 24 A cross-sectional view showing the process of manufacturing the semiconductor device according to the embodiment 3 of the present invention.

FIGS. 22 to 24 are cross-sectional views sequentially showing a process of manufacturing the termination region. A final configuration of the termination region is indicated as a RESURF layer 121 in FIG. 24 showing the final step.

The RESURF layer 121 shown in FIG. 24 includes a first RESURF layer 21, a second RESURF layer 22, a third RESURF layer 23, a fourth RESURF layer 24, a fifth RESURF layer 25, a sixth RESURF layer 26, and a seventh RESURF layer 27 that are arranged in the mentioned order from the P-type base 2 side and arranged so as to surround the P-type base 2.

C-2. Manufacturing Method 1

Next, a method for forming the RESURF layer 121 will be described with reference to FIGS. 22 to 24. Firstly, as shown in FIG. 22, an implantation mask M71 is patterned on the main surface where the active region 2 is formed.

The implantation mask M71 has a pattern in which portions corresponding to the first RESURF layer 21, the second RESURF layer 22, the third RESURF layer 23, and the fourth RESURF layer 24 are opening. A P-type impurity, such as Al, is ion-implanted over the implantation mask M71. Thereby, an implantation layer having an implantation amount and a depth equal to those of the fourth RESURF layer 24 is formed in a region corresponding to the first to fourth RESURF layers 21 to 24.

Then, after the implantation mask M71 is removed, in step shown in FIG. 23, an implantation mask M72 is patterned. The implantation mask M72 has a pattern in which portions corresponding to the first RESURF layer 21, the second RESURF layer 22, the fifth RESURF layer 25, and the sixth RESURF layer 26 are opening. A P-type impurity, such as Al, is ion-implanted over the implantation mask M72 with the amount of the impurity equal to that of the sixth RESURF layer 26. Thereby, an implantation layer having an implantation amount and a depth equal to those of the second RESURF layer 22 is formed in a region corresponding to the first and second RESURF layers 21 and 22, while an implantation layer having an implantation amount and a depth equal to those of the sixth RESURF layer 26 is formed in a region corresponding to the fifth and sixth RESURF layers 25 and 26.

Then, after the implantation mask M72 is removed, in step shown in FIG. 24, an implantation mask M73 is patterned. The implantation mask M73 has a pattern in which portions corresponding to the first RESURF layer 21, the third RESURF layer 23, the fifth RESURF layer 25, and the seventh RESURF layer 26 are opening. A P-type impurity, such as Al, is ion-implanted over the implantation mask M73 with the amount of the impurity equal to that in the seventh RESURF layer 27. Thereby, the first RESURF layer 21, the third RESURF layer 23, the fifth RESURF layer 25, and the seventh RESURF layer 27 are formed. The second RESURF layer 22, the fourth RESURF layer 24, and the sixth RESURF layer 26 are obtained since the implantation mask M73 prevents a further implantation of an impurity therein.

C-3. Device Configuration 2

Next, formulation is made in a case of, as described in the embodiments 1 and 2, providing regions in which the small regions having different implantation amounts are alternately arranged in multiple to thereby increase the number of levels of the effective implantation amount.

In this case, a RESURF layer defined by the effective implantation amount is inserted in the boundary between the RESURF layers having a single implantation amount. Therefore, the number of levels of the effective implantation amount is $(2^n-1)+\{(2^n-1)-1\}=\{2\times(2^n-1)-1\}$.

When a region where small regions in which implantation is performed and small regions in which no implantation is performed are alternately arranged in multiple is provided at an outermost periphery, the number of levels of the effective implantation amount is $\{2\times(2^n-1)\}$.

In this case, an effective implantation amount (including the single implantation amount) tj is represented by the following mathematical expression (4).

[Math. 4]

$$tj = a1 \times j/2^n (1 \leq j \leq 2 \times (2^n-1)) \qquad (4)$$

That is, the insertion of the RESURF layer having the effective implantation amount can almost double the number of levels of the implantation amount (level number) even though the number of times the implantation process is performed is the same.

From another point of view, the insertion of the RESURF layer having the effective implantation amount can reduce, by one, the number of times the implantation process has to be performed in order to obtain a certain number of levels of the implantation amount, though it is the effective implantation amount.

Here, an example case of n=3 will be described with reference to FIGS. 25 to 27. Based on the above-described theory, a RESURF layer having fourteen levels of implantation amounts, including a RESURF layer having the effective implantation amount, is formed through three implantation processes.

C-4. Manufacturing Method

Figure 25:
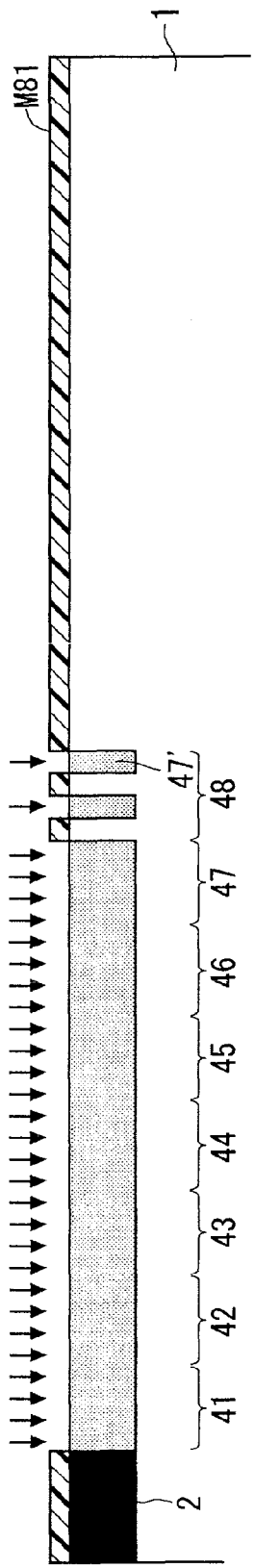
FIG. 25 A cross-sectional view showing the process of manufacturing the semiconductor device according to the embodiment 3 of the present invention.
Figure 26:
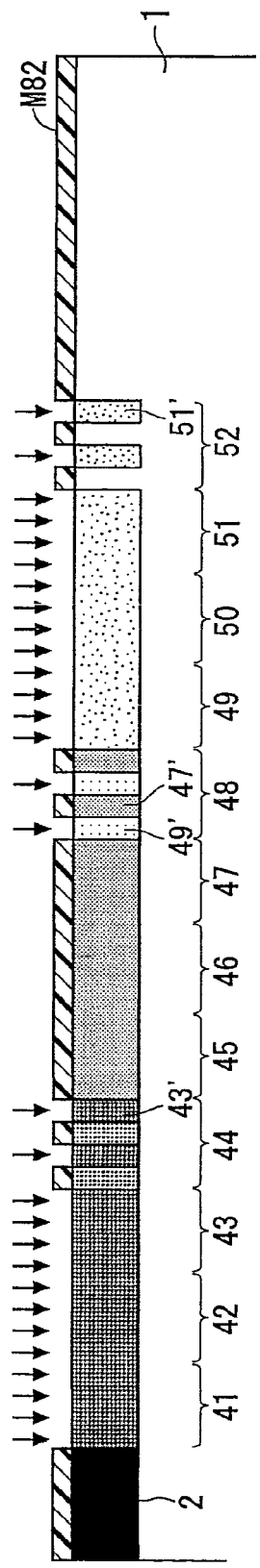
FIG. 26 A cross-sectional view showing the process of manufacturing the semiconductor device according to the embodiment 3 of the present invention.
Figure 27:
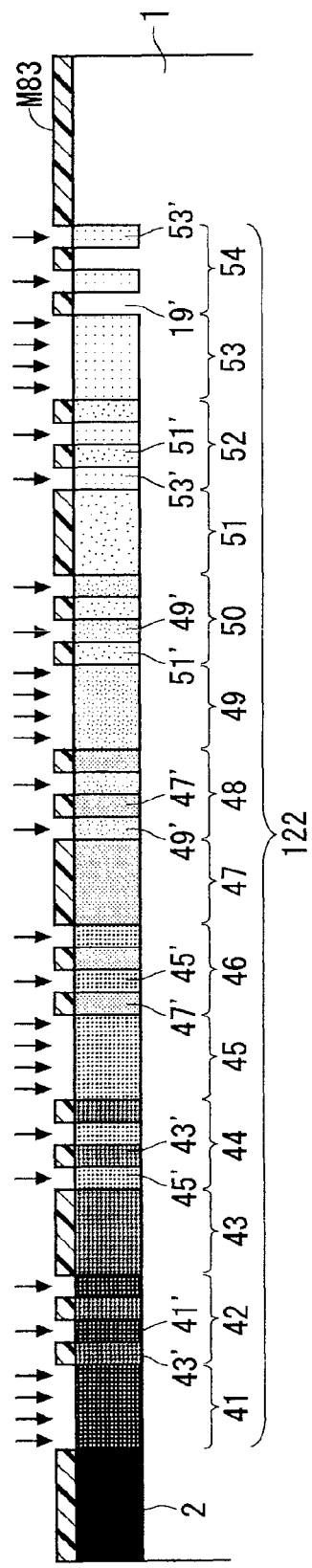
FIG. 27 A cross-sectional view showing the process of manufacturing the semiconductor device according to the embodiment 3 of the present invention.

FIGS. 25 to 27 are cross-sectional views sequentially showing a process of manufacturing the termination region. A final configuration of the termination region is indicated as a RESURF layer 122 in FIG. 27 showing the final step.

The RESURF layer 122 shown in FIG. 27 includes a first RESURF layer 41, a second RESURF layer 42, a third RESURF layer 43, a fourth RESURF layer 44, a fifth RESURF layer 45, a sixth RESURF layer 46, a seventh RESURF layer 47, an eighth RESURF layer 48, a ninth RESURF layer 49, a tenth RESURF layer 50, an eleventh RESURF layer 51, a twelfth RESURF layer 52, a thirteenth RESURF layer 53, and a fourteenth RESURF layer 54 that are arranged in the mentioned order from the P-type base 2 side and arranged so as to surround the P-type base 2. Among them, the second RESURF layer 42, the fourth RESURF layer 44, the sixth RESURF layer 46, the eighth RESURF layer 48, the tenth RESURF layer 50, the twelfth RESURF layer 52, and the fourteenth RESURF layer 54 are RESURF layers having effective implantation amounts.

The second RESURF layer 42 is configured with small regions 41' and small regions 43' being alternately arranged in multiple. The implantation amount in the small regions 41' is equal to that in the first RESURF layer 41. The implantation amount in the small regions 43' is equal to that in the third RESURF layer 43.

The fourth RESURF layer 44 is configured with small regions 43' and small regions 45' being alternately arranged in multiple. The implantation amount in the small regions 43' is equal to that in the third RESURF layer 43. The implantation amount in the small regions 45' is equal to that in the fifth RESURF layer 45.

The sixth RESURF layer 46 is configured with small regions 45' and small regions 47' being alternately arranged in multiple. The implantation amount in the small regions 45' is equal to that in the fifth RESURF layer 45. The implantation amount in the small regions 47' is equal to that in the seventh RESURF layer 47.

The eighth RESURF layer 48 is configured with small regions 47' and small regions 49' being alternately arranged in multiple. The implantation amount in the small regions 47' is equal to that in the seventh RESURF layer 47. The implantation amount in the small regions 49' is equal to that in the ninth RESURF layer 49.

The tenth RESURF layer 50 is configured with small regions 49' and small regions 51' being alternately arranged in multiple. The implantation amount in the small regions 49' is equal to that in the ninth RESURF layer 49. The implantation amount in the small regions 51' is equal to that in the eleventh RESURF layer 51.

The twelfth RESURF layer 52 is configured with small regions 51' and small regions 53' being alternately arranged in multiple. The implantation amount in the small regions 51' is equal to that in the eleventh RESURF layer 51. The implantation amount in the small regions 53' is equal to that in the thirteenth RESURF layer 53.

The fourteenth RESURF layer 54 is configured with small regions 53' and small regions 19' being alternately arranged in multiple. The implantation amount in the small regions 53' is equal to that in the thirteenth RESURF layer 53. No ion implantation is performed in the small regions 19'.

Next, a method for forming the RESURF layer 122 will be described with reference to FIGS. 25 to 27. Firstly, as shown in FIG. 25, an implantation mask M81 is patterned on the main surface where the active region 2 is formed.

The implantation mask M81 has a pattern in which portions corresponding to the first to seventh RESURF layers 41 to 47 and portions corresponding to the small regions 47' in the eighth RESURF layer 48 are opening. A P-type impurity, such as Al, is ion-implanted over the implantation mask M81. Thereby, an implantation layer having an implantation amount equal to that in the seventh RESURF layer 47 is formed in a region corresponding to the first to seventh RESURF layers 41 to 47, while the small regions 47' are formed in the eighth RESURF layer 18.

Then, after the implantation mask M81 is removed, in step shown in FIG. 26, an implantation mask M82 is patterned. The implantation mask M82 has a pattern in which portions corresponding to the first RESURF layer 41, the second RESURF layer 42, the third RESURF layer 43, the ninth RESURF layer 49, the tenth RESURF layer 50, and the eleventh RESURF layer 51, portions corresponding to the small regions 43' in the fourth RESURF layer 44, portions corresponding to the small regions 49' in the eighth RESURF layer 48, and portions corresponding to the small regions 51' in the twelfth RESURF layer 52 are opening. A P-type impurity, such as Al, is ion-implanted over the implantation mask M82 with the amount of the impurity equal to that in the eleventh RESURF layer 51. Thereby, an implantation layer having an implantation amount equal to that in the third RESURF layer 43 is formed in a region corresponding to the first to third RESURF layers 41 to 43 and in the small regions 49' in the eighth RESURF layer 48, while the small regions 43' are formed in the fourth RESURF layer 44.

Also, an implantation layer having an implantation amount equal to that in the eleventh RESURF layer 51 is formed in a region corresponding to the ninth to eleventh RESURF layers 49 to 51, while the small regions 51' are formed in the twelfth RESURF layer 52.

Then, after the implantation mask M82 is removed, in step shown in FIG. 27, an implantation mask M83 is patterned. The implantation mask M83 has a pattern in which portions corresponding to the first RESURF layer 41, the fifth RESURF layer 45, the ninth RESURF layer 49, and the thirteenth RESURF layer 53, portions corresponding to the small regions 41' in the second RESURF layer 42, portions corresponding to the small regions 45' in the fourth RESURF layer 44, portions corresponding to the small regions 45' in the sixth RESURF layer 46, portions corresponding to the small regions 49' in the eighth RESURF layer 48, portions corresponding to the small regions 49' in the tenth RESURF layer 50, portions corresponding to the small regions 53' in the twelfth RESURF layer 52, and portions corresponding to the small regions 53' in the fourteenth RESURF layer 54 are opening.

A P-type impurity, such as Al, is ion-implanted over the implantation mask M83 with the amount of the impurity equal to that in the thirteenth RESURF layer 53. Thereby, the first RESURF layer 41, the fifth RESURF layer 45, the ninth RESURF layer 49, and the thirteenth RESURF layer 53 are formed. Also, the small regions 41' in the second RESURF layer 42, the small regions 45' in the fourth RESURF layer 44, the small regions 45' in the sixth RESURF layer 46, the small regions 49' in the eighth RESURF layer 48, the small regions 49' in the tenth RESURF layer 50, the small regions 53' in the twelfth RESURF layer 52, and the small regions 53' in the fourteenth RESURF layer 54 are formed. The third RESURF layer 43, the seventh RESURF layer 47, and the eleventh RESURF layer 51 are obtained since the implantation mask M83 prevents a further implantation of an impurity therein.

The implantation masks M81 to M83 shown in FIGS. 25 to 27 are illustrative only, and a mask for the formation of a RESURF layer having fourteen levels of implantation amounts through three implantation processes is not limited thereto.

The implantation masks M81 to M83 are opening based on the following rules, which is applicable to a case of n implantation processes, too.

When the width of each of the $\{2 \times (2^n-1)\}$ regions having the single implantation amount or effective implantation amount is defined as w, a mask used for the implantation with the implantation amount $am = a1/2^{m-1}$ ($1 \le m \le n$) is configured with an opening having a width of $\{w \times (2^{n-m+1}-1)\}$; a partially opening portion having a width of w, a masking portion having a width of $\{w \times (2^{n-m+1}-1)\}$, and a partially opening portion having a width of w, which are repeatedly formed in the mentioned order from the P-type base side.

In a case of the RESURF structure, good characteristics are obtained when a1 is about one to two times the value given by the RESURF conditions of the semiconductor material.

C-5. Modification 1

In the embodiment 3 described above, the three implantation processes are performed with the same depth of implantation. Instead, the depth of implantation may be changed among implantation processes. In the following, a configuration of and a method for manufacturing the termination region according to a modification 1 of the embodiment 3 will be described with reference to FIGS. 28 to 30.

Figure 28:
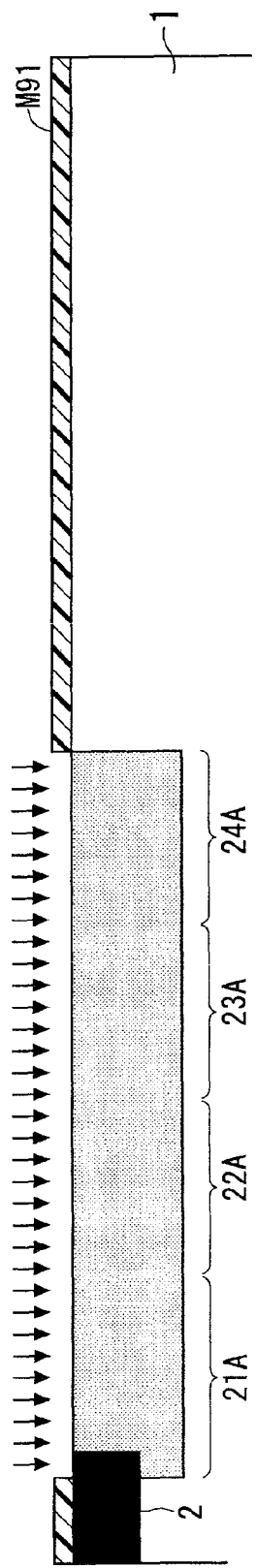
FIG. 28 A cross-sectional view showing a process of manufacturing a semiconductor device according to a modification 1 of the embodiment 3 of the present invention.
Figure 29:
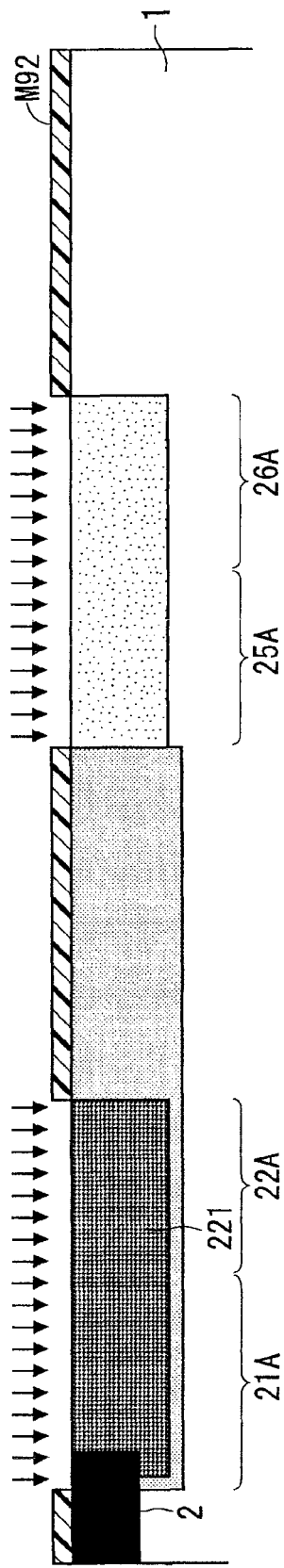
FIG. 29 A cross-sectional view showing the process of manufacturing the semiconductor device according to the modification 1 of the embodiment 3 of the present invention.
Figure 30:
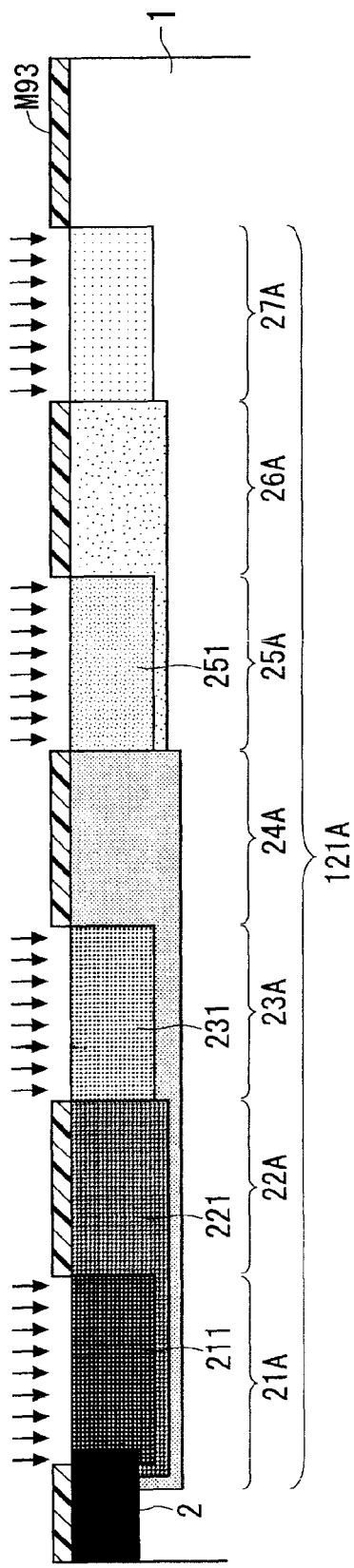
FIG. 30 A cross-sectional view showing the process of manufacturing the semiconductor device according to the modification 1 of the embodiment 3 of the present invention.

FIGS. 28 to 30 are cross-sectional views sequentially showing a process of manufacturing the termination region. A final configuration of the termination region is indicated as a RESURF layer 121A in FIG. 30 showing the final step.

The RESURF layer 121A includes a first RESURF layer 21A, a second RESURF layer 22A, a third RESURF layer 23A, a fourth RESURF layer 24A, a fifth RESURF layer 25A, a sixth RESURF layer 26A, and a seventh RESURF layer 27A that are arranged in the mentioned order from the P-type base 2 side and arranged so as to surround the P-type base 2.

The first RESURF layer 21A is configured such that an impurity layer 211 inside first RESURF layer is contained within an implantation layer having an implantation amount and a depth equal to those of an impurity layer 221 inside second RESURF layer that is included in the second RESURF layer 22A. The impurity layer 211 inside first RESURF layer is less deep than the impurity layer 221 inside second RESURF layer.

The second RESURF layer 22A is configured such that the impurity layer 221 inside second RESURF layer is contained within an implantation layer having an implantation amount and a depth equal to those of the fourth RESURF layer 24A. The impurity layer 221 inside second RESURF layer is less deep than the fourth RESURF layer 24A.

The third RESURF layer 23A is configured such that an impurity layer 231 inside third RESURF layer is contained within an implantation layer having an implantation amount and a depth equal to those of the fourth RESURF layer 24A. The impurity layer 231 inside third RESURF layer is less deep than the fourth RESURF layer 24A.

The fifth RESURF layer 25A is configured such that an impurity layer 251 inside fifth RESURF layer is contained within an implantation layer having an implantation amount and a depth equal to those of the sixth RESURF layer 26A. The impurity layer 251 inside fifth RESURF layer is less deep than the sixth RESURF layer 26A.

Adoption of such a configuration enables the change in the concentration in the first to third RESURF layers 21A to 23A to be gentle in the depth direction. As a result, the concentration of an electric field in the first to third RESURF layers 21A to 23A is relieved.

Next, a method for forming the RESURF layer 121A will be described with reference to FIGS. 28 to 30. Firstly, as shown in FIG. 28, an implantation mask M91 is patterned on the main surface where the active region 2 is formed.

The implantation mask M91 has a pattern in which portions corresponding to the first to fourth RESURF layers 21A to 24A are opening. A P-type impurity, such as Al, is ion-implanted over the implantation mask M91, and thereby an implantation layer having an implantation amount and a depth equal to those of the fourth RESURF layer 24A is formed in a region corresponding to the first to fourth RESURF layers 21A to 24A.

Then, after the implantation mask M91 is removed, in step shown in FIG. 29, an implantation mask M92 is patterned. The implantation mask M92 has a pattern in which portions corresponding to the first RESURF layer 21A, the second RESURF layer 22A, the fifth RESURF layer 25A, and the sixth RESURF layer 26A are opening. A P-type impurity, such as Al, is ion-implanted over the implantation mask M92 with implantation energy lower than that in the implantation process performed with use of the implantation mask M91. Thereby, an implantation layer having an implantation amount and a depth equal to those of the impurity layer 221 inside second RESURF layer and the sixth RESURF layer 26A is formed.

Then, after the implantation mask M92 is removed, in step shown in FIG. 30, an implantation mask M93 is patterned. The implantation mask M93 has a pattern in which portions corresponding to the first RESURF layer 21A, the third RESURF layer 23A, the fifth RESURF layer 25A, and the seventh RESURF layer 27A are opening. A P-type impurity, such as Al, is ion-implanted over the implantation mask M93 with implantation energy lower than that in the implantation process performed with use of the implantation mask M92. Thereby, the impurity layer 211 inside first RESURF layer is formed within the impurity layer 221 inside second RESURF layer, and the impurity layer 231 inside third RESURF layer is formed within the implantation layer having an implantation amount and a depth equal to those of the fourth RESURF layer 24A, and the impurity layer 251 inside fifth RESURF layer is formed within the implantation layer having an implantation amount and a depth equal to those of the sixth RESURF layer 26A, and the seventh RESURF layer 27A is formed within the semiconductor substrate 1.

The second RESURF layer 22A, the fourth RESURF layer 24A, and the sixth RESURF layer 26A are obtained since the implantation mask M93 prevents a further implantation of an impurity therein.

C-6. Modification 2

In a modification 2 of the embodiment 3, a configuration will be described with reference to FIGS. 31 to 33, in which the depth of implantation is changed among the implantation processes in a case of providing regions in which small regions having different implantation amounts are alternately arranged in multiple to thereby increase the number of levels of the effective implantation amount.

Figure 31:
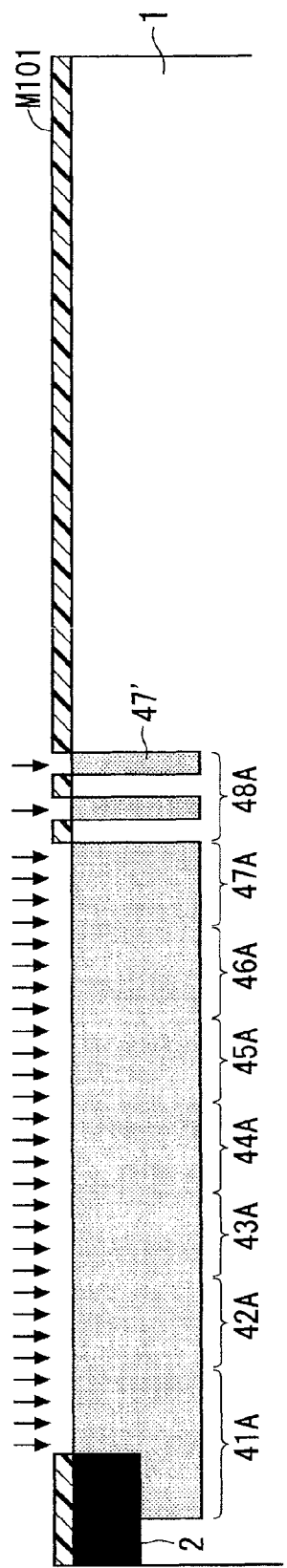
FIG. 31 A cross-sectional view showing a process of manufacturing a semiconductor device according to a modification 2 of the embodiment 3 of the present invention.
Figure 32:
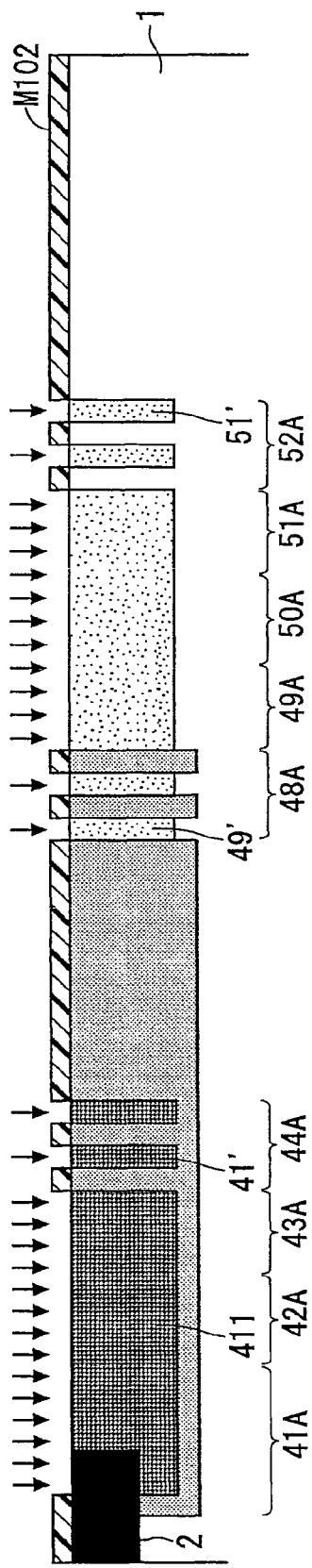
FIG. 32 A cross-sectional view showing the process of manufacturing the semiconductor device according to the modification 2 of the embodiment 3 of the present invention.
Figure 33:
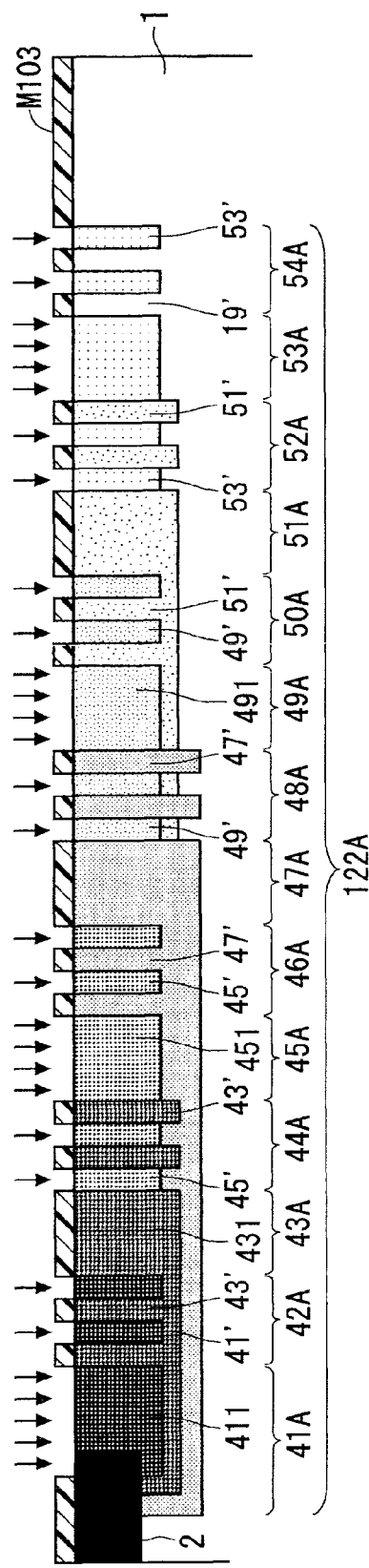
FIG. 33 A cross-sectional view showing the process of manufacturing the semiconductor device according to the modification 2 of the embodiment 3 of the present invention.

FIGS. 31 to 33 are cross-sectional views sequentially showing a process of manufacturing the termination region. A final configuration of the termination region is indicated as a RESURF layer 122A in FIG. 33 showing the final step.

The RESURF layer 122A shown in FIG. 33 includes a first RESURF layer 41A, a second RESURF layer 42A, a third RESURF layer 43A, a fourth RESURF layer 44A, a fifth RESURF layer 45A, a sixth RESURF layer 46A, a seventh RESURF layer 47A, an eighth RESURF layer 48A, a ninth RESURF layer 49A, a tenth RESURF layer 50A, an eleventh RESURF layer 51A, a twelfth RESURF layer 52A, a thirteenth RESURF layer 53A, and a fourteenth RESURF layer 54A that are arranged in the mentioned order from the P-type base 2 side and arranged so as to surround the P-type base 2. Among them, the second RESURF layer 42A, the fourth RESURF layer 44A, the sixth RESURF layer 46A, the eighth RESURF layer 48A, the tenth RESURF layer 50A, the twelfth RESURF layer 52A, and the fourteenth RESURF layer 54A are RESURF layers having effective implantation amounts.

The first RESURF layer 41A is configured such that an impurity layer 411 inside first RESURF layer is contained within is contained within an implantation layer having an implantation amount and a depth equal to those of the impurity layer 431 inside third RESURF layer that is included in the third RESURF layer 43A. The impurity layer 411 inside first RESURF layer is less deep than the impurity layer 431 within fourth RESURF layer.

The third RESURF layer 43A is configured such that an impurity layer 431 inside third RESURF layer is contained within an implantation layer having an implantation amount and a depth equal to those of the seventh RESURF layer 47A. The impurity layer 431 inside third RESURF layer is less deep than the seventh RESURF layer 47A.

The fifth RESURF layer 45A is configured such that an impurity layer 451 inside fifth RESURF layer is contained within an implantation layer having an implantation amount and a depth equal to those of the seventh RESURF layer 47A. The impurity layer 451 inside fifth RESURF layer is less deep than the seventh RESURF layer 47A.

The ninth RESURF layer 49A is configured such that an impurity layer 491 inside ninth RESURF layer is contained within an implantation layer having an implantation amount and a depth equal to those of the eleventh RESURF layer 51A. The impurity layer 491 inside ninth RESURF layer is less deep than the eleventh RESURF layer 51A.

The second RESURF layer 42A is configured with small regions 41' and small regions 43' being alternately arranged in multiple. The small regions 41' have an implantation amount and a depth equal to those of the impurity layer 411 inside first RESURF layer that is included in the first RESURF layer 41A. The small regions 43' have an implantation amount and a depth equal to those of the impurity layer 431 inside third RESURF layer that is included in the third RESURF layer 43.

The fourth RESURF layer 44A is configured with small regions 43' and small regions 45' being alternately arranged in multiple. The small regions 43' have an implantation amount and a depth equal to those of the impurity layer 431 inside third RESURF layer that is included in the third RESURF layer 43. The small regions 45' have an implantation amount and a depth equal to those of the impurity layer 451 inside fifth RESURF layer that is included in the fifth RESURF layer 45A.

The sixth RESURF layer 46A is configured with small regions 45' and small regions 47' being alternately arranged in multiple. The small regions 45' have an implantation amount and a depth equal to those of the impurity layer 451 inside fifth RESURF layer that is included in the fifth RESURF layer 45A. The small regions 47' have an implantation amount and a depth equal to those of the seventh RESURF layer 47A.

The eighth RESURF layer 48A is configured with small regions 47' and small regions 49' being alternately arranged in multiple. The small regions 47' have an implantation amount and a depth equal to those of the seventh RESURF layer 47A. The small regions 49' have an implantation amount and a depth equal to those of the impurity layer 491 inside ninth RESURF layer that is included in the ninth RESURF layer 49A.

The tenth RESURF layer 50A is configured with small regions 49' and small regions 51' being alternately arranged in multiple. The small regions 49' have an implantation amount and a depth equal to those of the impurity layer 491 inside ninth RESURF layer that is included in the ninth RESURF layer 49A. The small regions 51' have an implantation amount and a depth equal to those of the eleventh RESURF layer 51A.

The twelfth RESURF layer 52A is configured with small regions 51' and small regions 53' being alternately arranged in multiple. The small regions 51' have an implantation amount and a depth equal to those of the eleventh RESURF layer 51A. The small regions 53' have an implantation amount and a depth equal to those of the thirteenth RESURF layer 53A.

The fourteenth RESURF layer 54A is configured with small regions 53' and small regions 19' being alternately arranged in multiple. The small regions 53' have an implantation amount and a depth equal to those of the thirteenth RESURF layer 53A. No ion implantation is performed in the small regions 19'.

Adoption of such a configuration enables the change in the concentration in the first to third RESURF layers 41A to 43A to be gentle in the depth direction. As a result, the concentration of an electric field in the first to third RESURF layers 41A to 43A is relieved. Additionally, the first RESURF layer 41B overlaps the P-type base 2 in the width direction and the depth direction. Therefore, in a corner portion of the P-type base 2 near the first RESURF layer 41A, the change in the concentration in the depth direction is made gentle. As a result, the concentration of an electric field is relieved also in the corner portion of the P-type base 2 near the RESURF layer 41A.

Next, a method for forming the RESURF layer 122A will be described with reference to FIGS. 31 to 33. Firstly, as shown in FIG. 31, an implantation mask M101 is patterned on the main surface where the active region 2 is formed.

The implantation mask M101 has a pattern in which portions corresponding to the first to seventh RESURF layers 41A to 47A and portions corresponding to the small regions 47' in the eighth RESURF layer 48A are opening. A P-type impurity, such as Al, is ion-implanted over the implantation mask M101. Thereby, an implantation layer having an implantation amount equal to that in the seventh RESURF layer 47A is formed in a region corresponding to the first to seventh RESURF layers 41A to 47A, while the small regions 47' are formed in the eighth RESURF layer 48A.

Then, after the implantation mask M101 is removed, in step shown in FIG. 32, an implantation mask M102 is patterned. The implantation mask M102 has a pattern in which portions corresponding to the first RESURF layer 41A, the second RESURF layer 42A, the third RESURF layer 43A, the ninth RESURF layer 49A, the tenth RESURF layer 50A, and the eleventh RESURF layer 51A, portions corresponding to the small regions 41' in the fourth RESURF layer 44A, portions corresponding to the small regions 49' in the eighth RESURF layer 48A, and portions corresponding to the small regions 51' in the twelfth RESURF layer 52A are opening. A P-type impurity, such as Al, is ion-implanted over the implantation mask M102 with implantation energy lower than that in the implantation process performed with use of the implantation mask M101 and with the amount of the impurity equal to that in the eleventh RESURF layer 51A. Thereby, an implantation layer having an implantation amount equal to that in the third RESURF layer 43A is formed in regions corresponding to the first to third RESURF layers 41A to 43A and the small regions 49' in the eighth RESURF layer 48A, while the small regions 41' are formed in the fourth RESURF layer 44A.

Also, an implantation layer having an implantation amount equal to that in the eleventh RESURF layer 51A is formed in a region corresponding to the ninth to eleventh RESURF layers 49A to 51A, while the small regions 51' are formed in the twelfth RESURF layer 52A.

Then, after the implantation mask M102 is removed, in step shown in FIG. 33, an implantation mask M103 is patterned. The implantation mask M103 has a pattern in which portions corresponding to the first RESURF layer 41A, the fifth RESURF layer 45A, the ninth RESURF layer 49A, and the thirteenth RESURF layer 53A, portions corresponding to the small regions 41' in the second RESURF layer 42A, portions corresponding to the small regions 45' in the fourth RESURF layer 44A, portions corresponding to the small regions 45' in the sixth RESURF layer 46A, portions corresponding to the small regions 49' in the eighth RESURF layer 48A, portions corresponding to the small regions 49' in the tenth RESURF layer 50A, portions corresponding to the small regions 51' in the twelfth RESURF layer 52A, and portions corresponding to the small regions 53' in the fourteenth RESURF layer 54A are opening.

A P-type impurity, such as Al, is ion-implanted over the implantation mask M103 with implantation energy lower than that in the implantation process performed with use of the implantation mask M102 and with the amount of the impurity equal to that in the thirteenth RESURF layer 53A. Thereby, the first RESURF layer 41A, the fifth RESURF layer 45A, the ninth RESURF layer 49A, and the thirteenth RESURF layer 53A are formed. Also, the small regions 41' in the second RESURF layer 42A, the small regions 45' in the fourth RESURF layer 44A, the small regions 45' in the sixth RESURF layer 46A, the small regions 49' in the eighth RESURF layer 48A, the small regions 49' in the tenth RESURF layer 50A, the small regions 51' in the twelfth RESURF layer 52A, and the small regions 53' in the fourteenth RESURF layer 54A are formed. The third RESURF layer 43A, the seventh RESURF layer 47A, and the eleventh RESURF layer 51A are obtained since the implantation mask M103 prevents a further implantation of an impurity therein.

In the embodiments 1 to 3 described above, the following effects are further expected. That is, a RESURF layer in which the implantation amount progressively decreases from the P-type base layer toward the outside in a linear manner on average is formed with a relatively small implantation amount (for example, the maximum impurity concentration is $1.5 \times 10^{13}$ cm$^{-2}$ in a SiC substrate), and the depletion layer is, to some extent, caused to extend also to a region (first RESURF layer) in which a plurality of ion implantations are superimposed on each other. Thereby, the radius of curvature of the boundary of the depletion layer at the P-type base layer side is increased, thus providing further excellent high breakdown voltage performance.

Additionally, due to the gradient in the implantation amount with respect to the horizontal direction of the RESURF layer, the robustness against disturbance is obtained.

Moreover, the concentration in the RESURF layer is relatively low, and the depletion layer can extend, to some extent, to a region of the RESURF layer having the highest concentration. Therefore, excessive concentration of an electric field does not occur in the boundary of the depletion layer at the P-type base layer side. No severe limitation is put on the depth of the implantation layer having different implantation amounts (or concentrations). For example, the structure in which RESURF layers having different depths are superimposed as shown in FIG. 17 can improve even the breakdown voltage.

In the ion implantation process performed with different implantation amounts, instead of superimposing the impurity implantations, a region is provided in which an impurity is alternately implanted in separate regions. This can increase the number of levels in the RESURF structure. In this case, as described above, even if misalignment of the mask occurs, the effect of relieving the concentration of an electric field, which is exerted by the RESURF layer, is unchanged (an error in alignment of the implantation mask does not influence the breakdown voltage performance). Therefore, no problem occurs.

In the method described in the embodiment 1, a RESURF layer having five to six levels of implantation amounts in an effective sense is formed through three implantation processes. In the method described in the embodiment 2, a RESURF layer having five to six levels implantation amounts in an effective sense is formed in two implantation processes. Therefore, through a smaller number of implantation processes, a larger number of RESURF layers can be formed and the breakdown voltage can be increased.

D. Embodiment 4

In the embodiments 1 to 3, a case where the present invention is applied to a PN diode has been described. Here, the concentration of an electric field in the termination region can be relieved also when the present invention is applied not only to a MOSFET including a P-type implantation layer (P-type well) having a relatively high concentration of P-type impurity but also to a termination region of a Schottky barrier diode.

Figure 34:
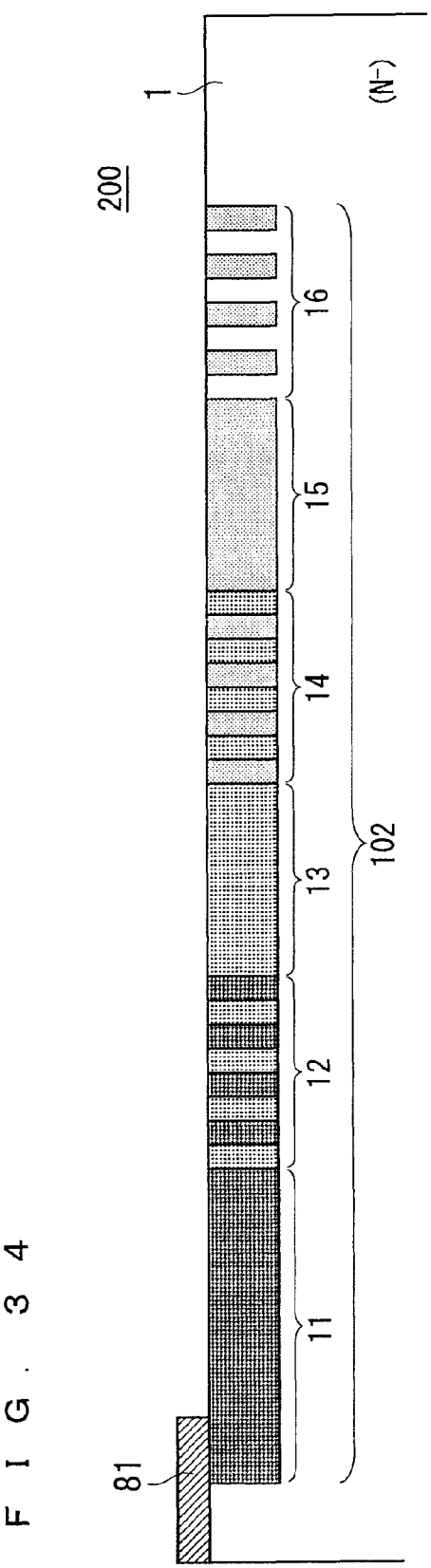
FIG. 34 A cross-sectional view showing a configuration in a case where the present invention is applied to a Schottky barrier diode.

FIG. 34 is a cross-sectional view showing a termination region of a Schottky barrier diode 200 in a case where the present invention is applied thereto.

The Schottky barrier diode 200 is formed on a semiconductor substrate 1 containing a relatively low concentration of N-type impurity. A RESURF layer 102 is formed such that a first RESURF layer 11 is arranged below a peripheral portion of a Schottky electrode 81 that is provided on a main surface of the semiconductor substrate 1. The RESURF layer 102 has the same configuration as that of the RESURF layer 102 shown in FIG. 9, and a redundant description is omitted.

Generally, in a Schottky barrier diode, a P-type implantation layer containing a relatively high concentration of P-type impurity is provided below a peripheral portion of a Schottky electrode, in order to relieve the concentration of an electric field in an end portion of the Schottky electrode. However, when the implantation amount in the first RESURF layer 11 is at least one to two times the value given by the RESURF conditions of the semiconductor material (conditions under which the first RESURF layer 11 is not completely depleted), it is not particularly necessary to separately provide a P-type implantation layer.

In the Schottky barrier diode 200 shown in FIG. 34, a portion to be protected is a peripheral portion (this portion corresponds to the active region) located below the Schottky electrode 81. Accordingly, the first RESURF layer 11 is configured to extend to a region located below the peripheral portion of the Schottky electrode 81.

In the Schottky barrier diode 200, an electric field concentrates also in an inner peripheral portion of the first RESURF layer 11. To avoid an influence of the concentration of an electric field on the peripheral portion located below the Schottky electrode 81, it is desirable that the Schottky electrode 81 and the first RESURF layer 11 overlap each other by several µm or more.

It may be acceptable that, during the formation of the RESURF layer 102, a part of the portion (active region) located below the Schottky electrode 81 is simultaneously implanted so that a JBS (Junction Barrier Schottky barrier diode) or a MPS (Merged PN-Schottky barrier diode) is provided.

E. Embodiment 5

In the embodiments 1 to 3, a case where the present invention is applied to a PN diode has been described. Here, the concentration of an electric field in the peripheral portion of the high concentration implantation layer can be relieved also when the present invention is applied to a LDMOSFET (Laterally Diffused MOSFET).

Figure 35:
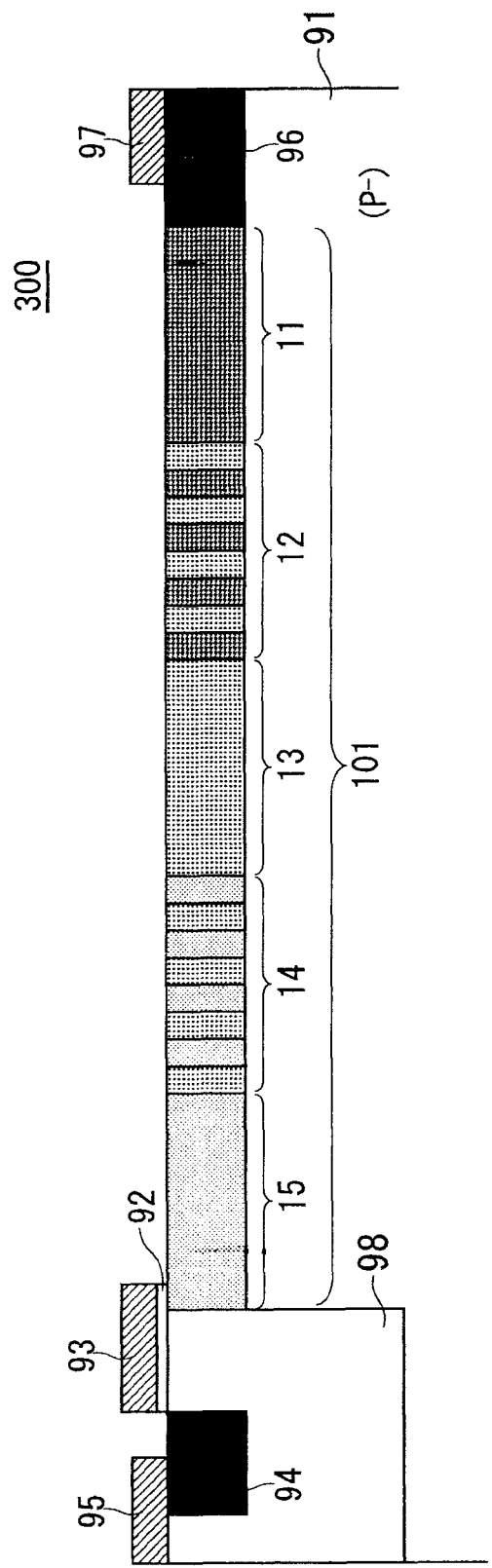
FIG. 35 A cross-sectional view showing a configuration in a case where the present invention is applied to an LDMOS-FET.

FIG. 35 is a cross-sectional view showing an active region of a LDMOSFET 300 in a case where the present invention is applied thereto.

The LDMOSFET 300 is formed on a semiconductor substrate 91 containing a relatively low concentration of P-type impurity. The LDMOSFET 300 includes a P-type implantation layer (P-type well) 98, a gate electrode 93, an N-type implantation layer 94, a source electrode 95, an N-type implantation layer 96, a drain electrode 97, and a RESURF layer 101. The P-type implantation layer (P-type well) 98 is provided in a main surface of the semiconductor substrate 91, and contains a relatively high concentration of P-type impurity. The gate electrode 93 is provided on the semiconductor substrate 91 with interposition of a gate oxidation film 92 therebetween. The N-type implantation layer 94 is provided in a surface of the P-type well 98, and contains a relatively high concentration of N-type impurity that serves as a source. The source electrode 95 is provided on the P-type well 98 and the N-type implantation layer 94. The N-type implantation layer 96 contains a relatively high concentration of N-type impurity that serves as a drain and is spaced apart from the source. The drain electrode 97 is provided on the N-type implantation layer 96. The RESURF layer 101 is provided between the gate and the drain, and contains a relatively low concentration of N-type impurity.

In the RESURF layer 101, a portion at the N-type implantation layer 96 side is a first RESURF layer 11, and the terminal of a fifth RESURF layer 15 is in contact with a side surface of the P-type well 98.

It is acceptable that a non-implanted region exists between the terminal of the fifth RESURF layer 15 and the P-type well 98, as long as the gate electrode 95 covers, even a little, the terminal of the fifth RESURF layer 15. Additionally, it is acceptable that the implantation is performed such that the fifth RESURF layer 15 and the P-type well 98 overlap each other, as long as a portion located below the drain-side end of the gate electrode 95 is an N-type impurity layer. Even in such a configuration, a gate threshold voltage is unchanged because the LDMOSFET is not turned on unless a channel in a surface of the P-type well 98 is opened.

Although the gate and drain portions of the LDMOSFET 300 and the termination region are different in terms of arrangement of electrodes, the purpose of providing the RESURF layer is the same. The RESURF layer 101 is provided in order to relieve the concentration of an electric field in a peripheral portion of a high concentration implantation layer, which is caused when a high voltage is applied between a high concentration implantation layer (corresponding to the drain in the active region of the LDMOSFET, and to the P-base in the termination region of the vertical type diode) having a conductive type different from that of the semiconductor substrate, and a back surface of the semiconductor substrate as well as a region (corresponding to the source and the P-type well in the active region of the LDMOSFET, and to the dicing line and the channel stopper in the termination region of a vertical type diode) having substantially the same potential as that of the back surface of the semiconductor substrate.

F. Other Examples of Application

In the embodiments 1 to 3, the application to the vertical type device has been illustrated. However, a similar RESURF structure is applicable to a lateral type device, as long as a mechanism that holds the breakdown voltage in a peripheral portion (termination region) of the device is necessary.

In the embodiments 1 to 3, the application to a PN junction diode including an N-type semiconductor substrate and a P-type implantation layer has been described. However, even in a case where all the conductive types are opposite to the above-mentioned ones, the same effects are obtained.

Moreover, not only the application to the PN junction diode but also applications to a transistor such as a MOSFET, an IGBT, and a BJT (Bipolar Junction Transistor) provide the same effects. Needless to say, an application as a terminal structure of the lateral type LDMOSFET according to the embodiment 5 is possible.

The material of the semiconductor substrate is not limited to SiC. A substrate made of a semiconductor having a wide band-gap, such as a gallium nitride material or diamond, is adoptable. A Si substrate is also adoptable. The optimum implantation amount in the RESURF layer is determined mainly by the dielectric constant and the breakdown electric field of the semiconductor material that is used. The optimum width of the RESURF layer is determined mainly by the breakdown electric field and a necessary breakdown voltage of the semiconductor material.

A switching element or a diode element made of such a wide band-gap semiconductor has a high voltage resistance and a high allowable current density, and therefore can be downsized as compared with a silicon semiconductor. By using the downsized switching element and the downsized diode element, a semiconductor device module incorporated with these elements can also be downsized.

A heat resistance is also high. Therefore, a heat dissipation fin of a heatsink can be downsized, and air cooling instead of water cooling is adoptable for the cooling. This can further downsize the semiconductor device module.

Any impurity may be used for the implantation, as long as the impurity substitutes for atoms of the semiconductor material and is activated. For example, B (boron), N (nitrogen), Al (aluminum), P (phosphorus), As (arsenic), and In (indium) are adoptable. However, an impurity having a larger diffusion length makes a change in the implantation amount (or concentration) more gentle in an interface between regions having different implantation amounts, and thus further relieve the concentration of an electric field. Therefore, in a case of the N-type semiconductor substrate, B (boron) or Al (aluminum) is implanted to form a P-type implantation layer. Thus, better effects are expected.

The invention claimed is:
1. A semiconductor device comprising:
an active region formed in a surface of a semiconductor layer having a first conductive type; and
a plurality of electric field relief layers that are defined by impurity regions having a second conductive type, said plurality of electric field relief layers being arranged from a peripheral portion of said active region toward the outside so as to surround said active region,
wherein
said plurality of electric field relief layers are configured such that an impurity implantation amount decreases from said active region side toward the outside,
said plurality of electric field relief layers include:
a first electric field relief layer whose entire region is implanted with an impurity having the second conductive type at a first surface density;
a second electric field relief layer whose entire region is implanted with an impurity having the second conductive type at a second surface density; and
a third electric field relief layer configured with a plurality of first small regions and a plurality of second small regions being alternately arranged, said first small region having a width in a plane direction smaller than that of said first electric field relief layer, said first small region being implanted with an impu- rity having the second conductive type at said first surface density, said second small region having a width in the plane direction smaller than that of said second electric field relief layer, said second small region being implanted with an impurity having the second conductive type at said second surface density, said third electric field relief layer is arranged between said first electric field relief layer and said second electric field relief layer with respect to the plane direction, and the average surface density of said third electric field relief layer takes a value between said first surface density and said second surface density.

2. The semiconductor device according to claim 1, wherein in said plurality of electric field relief layers, a final electric field relief layer provided in the last when said active region is defined as the head is configured with a plurality of third small regions and a plurality of non-implanted regions being alternately arranged, said third small region having a width in the plane direction smaller than that of a pre-final electric field relief layer that immediately precedes said final electric field relief layer, said third small region being implanted with an impurity having the second conductive type at a surface density equal to that of said pre-final electric field relief layer, said non-implanted region being formed of said semiconductor layer not implanted with an impurity having the second conductive type.

3. The semiconductor device according to claim 1, wherein in said second electric field relief layer, the depth of implantation in the impurity region thereof is greater than the depth of implantation in the impurity region of said first electric field relief layer.

4. The semiconductor device according to claim 3, wherein an impurity region that is formed simultaneously with said impurity region of said second electric field relief layer so as to have a depth and an impurity concentration equal to those of said impurity region of said second electric field relief layer contains, with respect to a cross-sectional direction, an impurity region that is formed simultaneously with said impurity region of said first electric field relief layer so as to have a depth and an impurity concentration equal to those of said impurity region of said first electric field relief layer.

5. The semiconductor device according to claim 1, wherein in a case where said first electric field relief layer is provided adjacent to said active region, the depth of implantation and an implanted region of said impurity region are set such that said impurity region of said first electric field relief layer covers the peripheral portion of said active region or the whole of said active region.

6. The semiconductor device according to claim 5, wherein said first electric field relief layer also serves as said active region.

7. The semiconductor device according to claim 1, wherein said third electric field relief layer is formed such that one of said first and second small regions having a larger implantation amount have a constant width with respect to the plane direction, while the other of said first and second small regions having a smaller implantation amount have their width with respect to the plane direction gradually increasing at a location farther from said active region.

8. The semiconductor device according to claim 1, wherein said third electric field relief layer formed such that one of said first and second small regions having a larger implantation amount have their width with respect to the plane direction gradually decreasing at a location farther from said active region, while the other of said first and second small regions having a smaller implantation amount have their width with respect to the plane direction gradually increasing at a location farther from said active region.

9. The semiconductor device according to claim 1, wherein said active region corresponds to an anode region of a PN junction diode.

10. The semiconductor device according to claim 1, wherein said active region corresponds to a region located below a Schottky electrode of a Schottky barrier diode.

11. The semiconductor device according to claim 1, wherein said active region corresponds to a partial region of a transistor including a MOSFET, an IGBT, a BJT.

12. The semiconductor device according to claim 11, wherein said active region corresponds to a drain region of an LDMOSFET (Laterally Diffused MOSFET) having a source electrode, a gate electrode, and a drain electrode arranged in the plane direction on a main surface of said semiconductor layer, said plurality of electric field relief layers are arranged between said drain region and a well region including a source region.

13. The semiconductor device according to claim 1, wherein said semiconductor layer is made of a wide band-gap semiconductor.

14. A method for manufacturing the semiconductor device according to claim 1, said method comprising the steps of:
(a) forming a first implantation mask on said semiconductor layer and ion-implanting the impurity having the second conductive type at said first surface density, to thereby form said first electric field relief layer and said first small regions; and
(b) after said step (a), forming a second implantation mask on said semiconductor layer and ion-implanting the impurity having the second conductive type at said second surface density, to thereby form said second electric field relief layer and said second small regions.

15. A method for manufacturing the semiconductor device according to claim 1, said method comprising the steps of:
(a) forming a first implantation mask on said semiconductor layer and ion-implanting the impurity having the second conductive type at said second surface density, so that an impurity layer that is identical to said second electric field relief layer is formed in a region where said first electric field relief layer is formed, and said second small regions are also formed; and
(b) after said step (a), forming, on said semiconductor layer, a second implantation mask that covers at least said second electric field relief layer, and ion-implanting the impurity having the second conductive type at a surface density that, when added to said second surface density, results in said first surface density, to thereby form said first electric field relief layer and said first small regions.

* * * * *